(12) United States Patent
Jung et al.

(10) Patent No.: US 10,930,740 B2
(45) Date of Patent: Feb. 23, 2021

(54) MULTI-DIRECTION CHANNEL TRANSISTOR AND SEMICONDUCTOR DEVICE INCLUDING THE MULTI-DIRECTION CHANNEL TRANSISTOR

(71) Applicant: Samsung Electronics Co., Ltd., Suwon-si (KR)

(72) Inventors: Hae-in Jung, Suwon-si (KR); Moon-young Jeong, Suwon-si (KR); Joon Han, Hwaseong-si (KR); Satoru Yamada, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/546,506

(22) Filed: Aug. 21, 2019

(65) Prior Publication Data
US 2020/0303504 A1 Sep. 24, 2020

(30) Foreign Application Priority Data
Mar. 19, 2019 (KR) .......................... 10-2019-0031473

(51) Int. Cl.
*H01L 29/10* (2006.01)
*H01L 27/02* (2006.01)
(Continued)

(52) U.S. Cl.
CPC .... *H01L 29/1037* (2013.01); *H01L 21/30604* (2013.01); *H01L 21/823418* (2013.01);
(Continued)

(58) Field of Classification Search
CPC ............. H01L 29/1037; H01L 29/4175; H01L 29/41791; H01L 27/0207; H01L 27/0886; H01L 27/10897
See application file for complete search history.

(56) References Cited

U.S. PATENT DOCUMENTS 7,691,699 B2  4/2010  Chung et al.
7,786,529 B2  8/2010  Kim
(Continued)

FOREIGN PATENT DOCUMENTS

JP    H05110083    4/1993

*Primary Examiner* — Zandra V Smith
*Assistant Examiner* — John M Parker
(74) *Attorney, Agent, or Firm* — Harness, Dickey & Pierce, P.L.C.

(57) ABSTRACT

Provided are a multi-direction channel transistor having a gate having an increased effective width and a multi-direction channel, and a semiconductor device including the multi-direction channel transistor, wherein the multi-direction channel transistor includes at least one fin on an active region on a substrate and disposed adjacent to a recess extending in a first direction; a gate line extending in a second direction crossing the first direction and covering at least a portion of the at least one fin and the recess; source/drain regions on the active region at both sides of the gate line; and a channel region in the active region under the gate line between the source/drain regions, wherein the first direction is diagonal to the second direction, and a dielectric film under the gate line has substantially the same thickness on both the at least one fin and the recess.

20 Claims, 21 Drawing Sheets

(51) Int. Cl.
*H01L 29/08* (2006.01)
*H01L 29/423* (2006.01)
*H01L 29/417* (2006.01)
*H01L 27/11573* (2017.01)
*H01L 27/108* (2006.01)
*H01L 21/8234* (2006.01)
*H01L 21/306* (2006.01)
*H01L 27/11526* (2017.01)
*H01L 27/088* (2006.01)

(52) U.S. Cl.
CPC .. *H01L 21/823431* (2013.01); *H01L 27/0207* (2013.01); *H01L 27/0886* (2013.01); *H01L 27/10897* (2013.01); *H01L 27/11526* (2013.01); *H01L 27/11573* (2013.01); *H01L 29/0847* (2013.01); *H01L 29/4175* (2013.01); *H01L 29/41791* (2013.01); *H01L 29/42364* (2013.01)

(56) References Cited

U.S. PATENT DOCUMENTS

| | | | |
|---|---|---|---|
| 8,013,367 B2 | 9/2011 | Doris et al. | |
| 8,614,481 B2 | 12/2013 | Lee | |
| 9,634,122 B2 | 4/2017 | Hsiao et al. | |
| 2003/0102518 A1* | 6/2003 | Fried | H01L 27/1203 257/401 |
| 2005/0199913 A1* | 9/2005 | Hofmann | H01L 27/115 257/204 |
| 2006/0255412 A1 | 11/2006 | Ramaswamy et al. | |
| 2007/0120156 A1 | 5/2007 | Liu et al. | |
| 2015/0115392 A1* | 4/2015 | Yoon | H01L 27/10894 257/499 |
| 2016/0133522 A1* | 5/2016 | Kang | H01L 21/76816 438/283 |
| 2016/0163637 A1* | 6/2016 | Jung | H01L 27/108 257/776 |
| 2018/0182722 A1* | 6/2018 | Kim | H01L 27/10891 |

* cited by examiner

MULTI-DIRECTION CHANNEL TRANSISTOR AND SEMICONDUCTOR DEVICE INCLUDING THE MULTI-DIRECTION CHANNEL TRANSISTOR

CROSS-REFERENCE TO RELATED APPLICATION

This application claims the benefit of Korean Patent Application No. 10-2019-0031473, filed on Mar. 19, 2019, in the Korean Intellectual Property Office, the disclosure of which is incorporated herein in its entirety by reference.

BACKGROUND

The inventive concepts relate to a semiconductor device, and more particularly, to a transistor including a fin disposed adjacent to a recess and a semiconductor device including the transistor.

According to the development of electronic technology, recent down-scaling of a semiconductor device is rapidly progressing. Recently, various researches have proceeded to optimize the structure of the transistor in the semiconductor device in order to increase operation speed as well as accuracy with respect to operation.

SUMMARY

The inventive concepts provide a multi-direction channel transistor including a gate having an increased effective width and a multi-direction channel, and a semiconductor device including the multi-direction channel transistor.

According to some example embodiments of the inventive concepts, there is provided a multi-direction channel transistor including at least one fin on an active region on a substrate and disposed adjacent to a recess extending in a first direction, a first gate line covering at least a portion of the at least one fin and the recess and extending in a second direction crossing the first direction, source/drain regions in the active region at both sides of the gate line, and a channel region in the active region under the gate line between the source/drain regions, wherein the first direction is a diagonal direction with respect to the second direction, and a dielectric film under the gate line has substantially the same thickness on both the at least one fin and the recess.

According some example embodiments of the inventive concepts, there is provided a multi-direction channel transistor including a first transistor including at least one first fin on a first active region on a substrate and disposed adjacent to a first recess extending in a first direction, and a first gate line extending in a second direction crossing the first direction while covering at least a portion of the at least one first fin and the first recess, and a second transistor including at least one second fin on a second active region on the substrate and disposed adjacent to a second recess extending in a third direction, and a second gate line extending in a fourth direction and covering at least a portion of the at least one second fin and the second recess, wherein the first direction is a direction perpendicular to the second direction in the first active region and the third direction is a direction diagonal to the fourth direction on the second active region.

According to some example embodiments of the inventive concepts, there is provided a semiconductor device including a substrate including a cell region and a peripheral region, the cell region including a plurality of cells, and the peripheral region disposed adjacent to the cell region, the peripheral region including at least one first transistor, wherein the at least one first transistor includes at least one first fin formed on a first active region on the peripheral region and disposed adjacent to a first recess extending in a first direction, and a first gate line extending in a second direction crossing the first direction and covering at least a portion of the at least one first fin and the first recess, the first direction is diagonal to the second direction on the first active region, and a dielectric film under the first gate line has substantially the same thickness on both the at least one first fin and the first recess.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1:
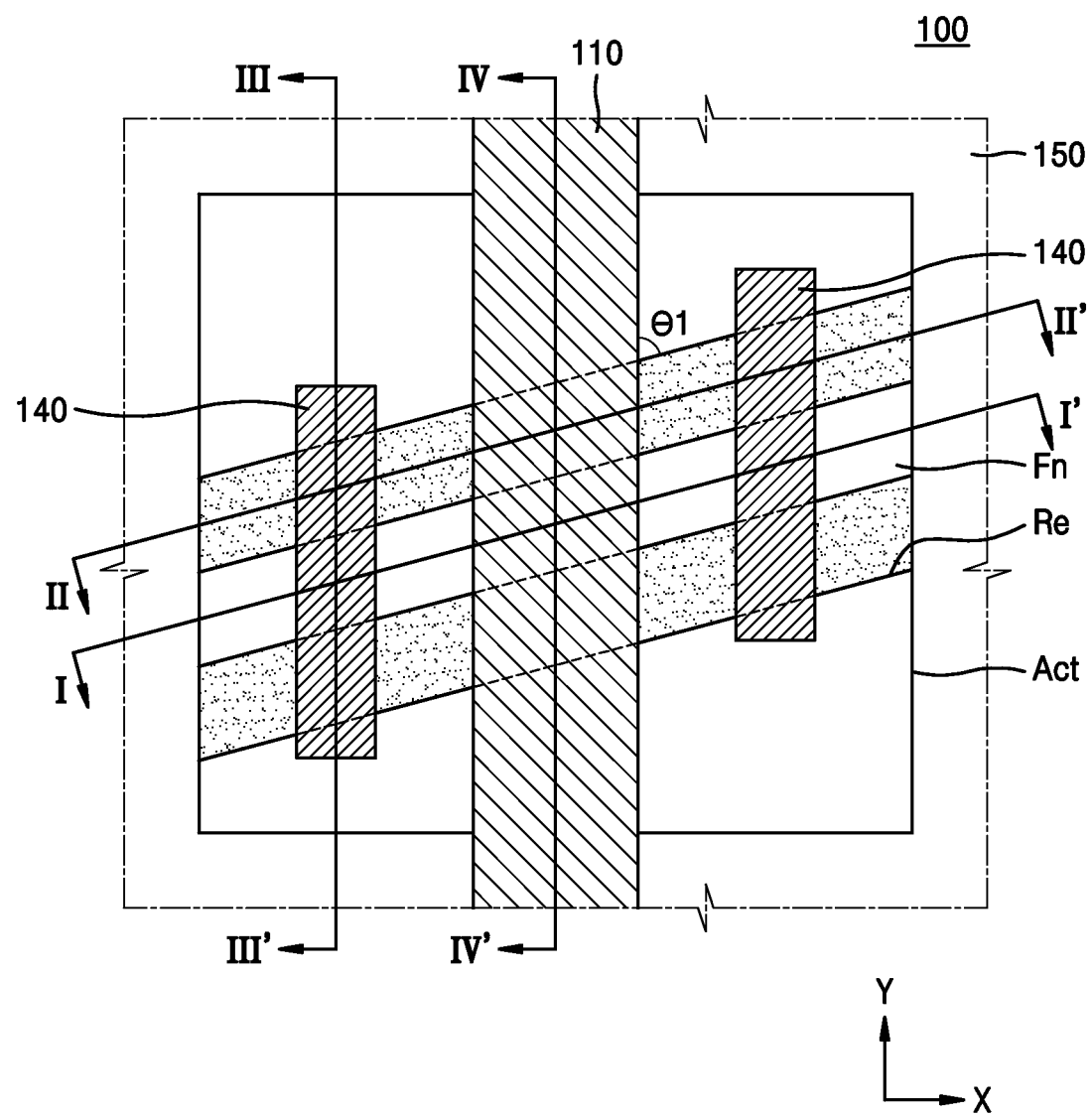
FIG. 1 is a plan view of a multi-direction channel transistor according to some example embodiment of the inventive concepts.

Hereinafter, some embodiments of the inventive concepts will be described in detail with reference to the accompanying drawings. The same reference numerals are used for the same constituent elements in the drawings, and duplicate description thereof will be omitted.

FIG. 1 is a plan view of a multi-direction channel transistor according to some example embodiments of the inventive concepts. FIGS. 2A to 2D are cross-sectional views respectively taken along lines I-I', II-II', III-III', and IV-IV' of FIG. 1.

Referring to FIGS. 1 and 2A to 2D, a multi-direction channel transistor 100 according to some example embodiments of the inventive concepts may include a substrate 101, an active region Act, a fin Fn, a gate line 110, and/or a contact 140.

The substrate 101 may include silicon (Si), for example, monocrystalline silicon, polycrystalline silicon, and/or amorphous silicon. However, the material of the substrate 101 is not limited to silicon. For example, in some example embodiments, the substrate 101 may include a Group IV semiconductor such as germanium and the like, a Group IV-IV compound semiconductor such as silicon germanium (SiGe), silicon carbide (SiC), and the like, and/or a Group III-V compound semiconductor such as gallium arsenide (GaAs), indium arsenide (InAs), indium phosphide (InP), and the like.

The substrate 101 may include a substrate based on a silicon bulk substrate or a substrate based on a silicon on insulator (SOI) substrate. The substrate 101 is not limited to the silicon bulk substrate or the SOI substrate, and may include a substrate based on an epitaxial wafer, a polished wafer, an annealed wafer, or the like. The substrate 101 may be classified into a P-type substrate or an N-type substrate depending on the type of doped impurity ions. In addition, the substrate 101 may include various structures, for example, a conductive structure such as a well region doped with impurities and an insulating structure such as a device isolation region.

An active region Act may be formed on the substrate 101. The active region Act may be disposed adjacent to a device isolation region 150 and may have a rectangular shape on the plan view as viewed from above, as shown in FIG. 1. However, the shape of the active region Act is not limited to a rectangle. The device isolation region 150 may be formed to have a predetermined (or alternatively given) depth in the substrate 101 and may include an insulating material. For example, the device isolation region 150 may include any one from among an oxide film, a nitride film, and an oxynitride film.

Source/drain regions 120 and a channel region 130 may be formed in the active region Act. The source/drain region 120 may be formed by doping an upper portion of the active region Act of both sides of a gate line 110 with impurity ion. Alternatively, the source/drain region 120 may include a heavily doped region doped heavily and deeply with impurity ions and a lightly doped region doped lightly and shallowly with impurity ions. The channel region 130 may be formed between the source/drain regions 120 under the gate line 110.

Figure 2A:
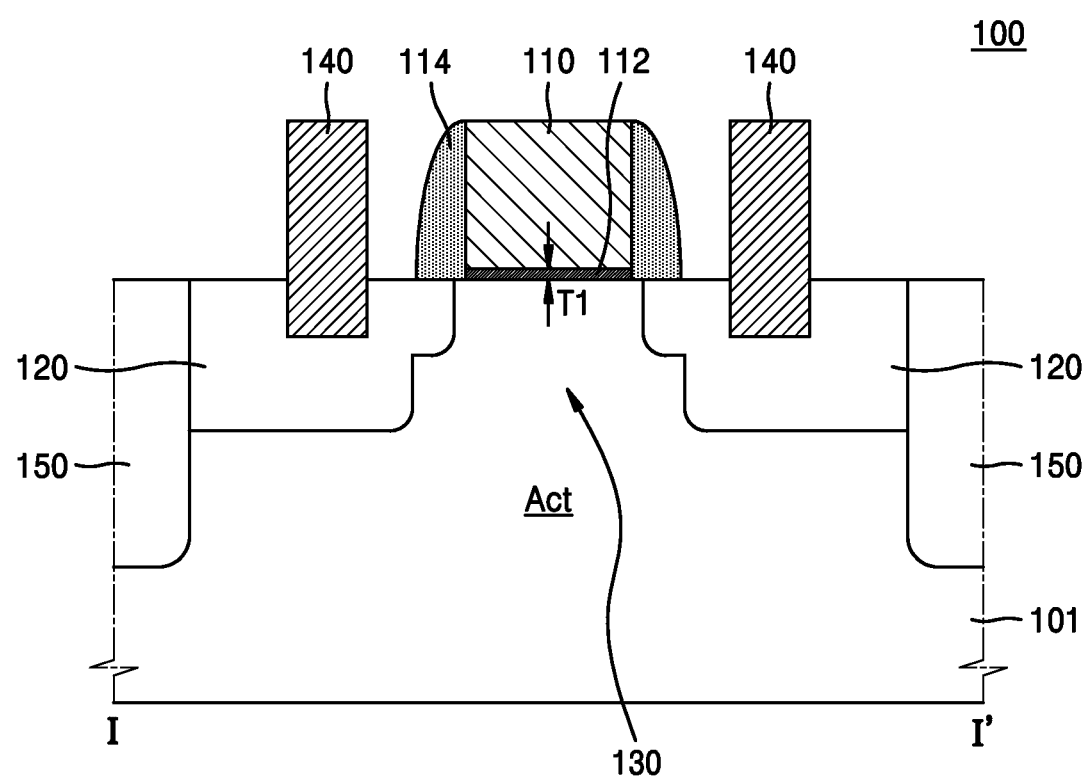
FIGS. 2A to 2D are cross-sectional views respectively taken along lines I-I', II-II', III-III', and IV-IV' of FIG. 1.
Figure 2B:
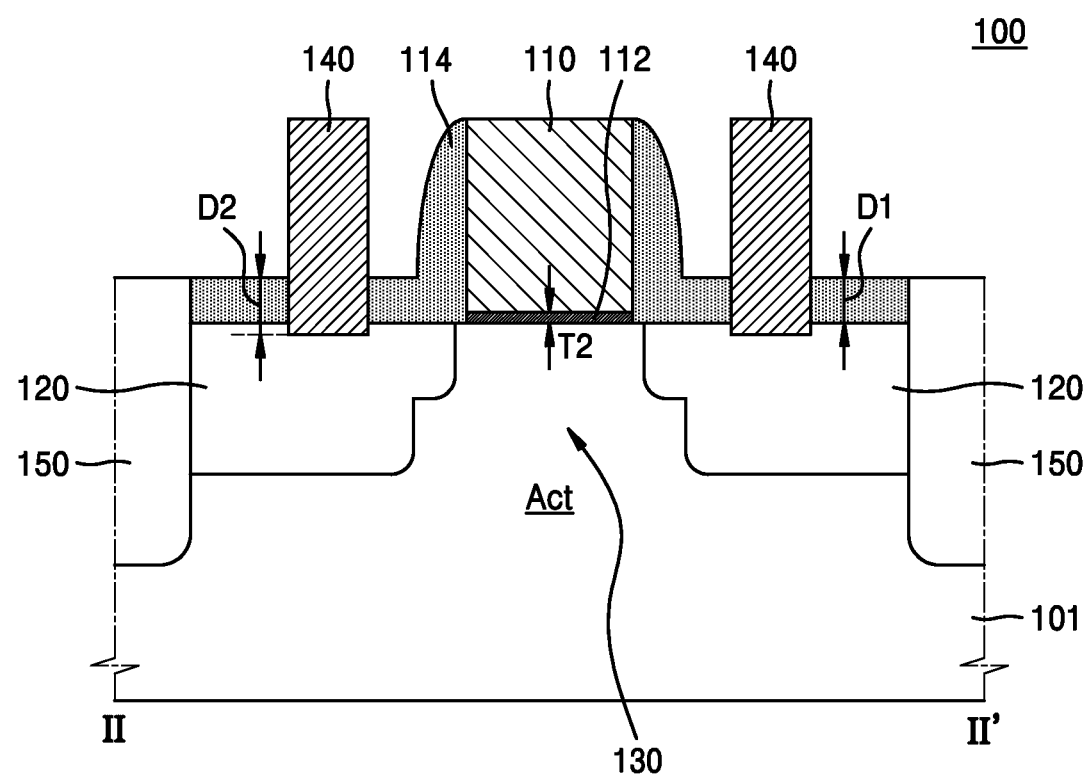
Figure 2C:
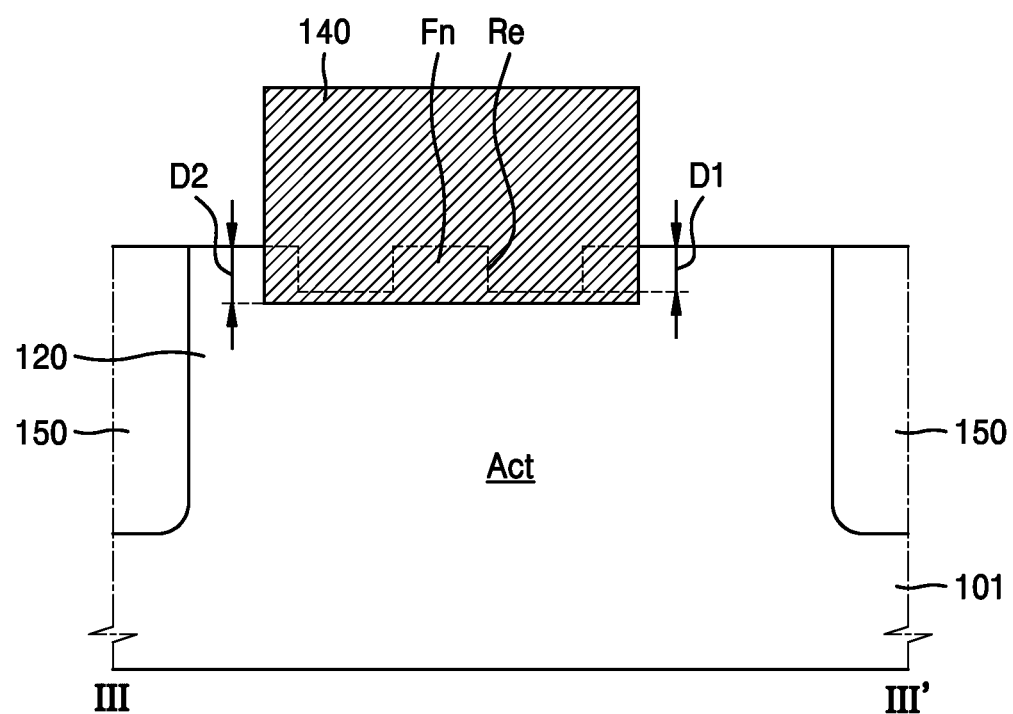
Figure 2D:
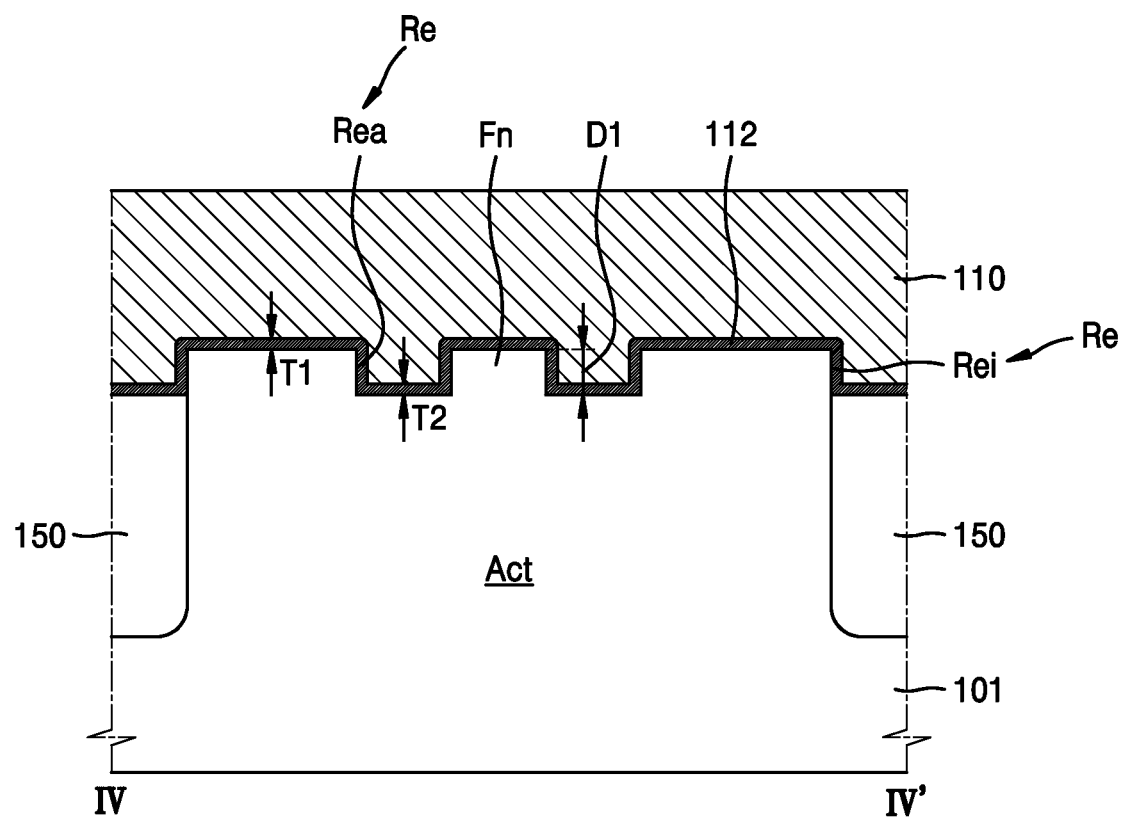

At least one fin Fn disposed adjacent to a recess Re may be formed in the upper portion of the active region Act. As shown in FIG. 2D, one fin Fn may be formed by two recesses Re in the upper portion of the active region Act. When the recesses Re formed in the device isolation region 150 are considered together, three fins Fn may be formed on the active region Act. The number of recesses Re and thus the number of fins Fn are not limited to the above-described number. For example, three or more recesses Re may be formed on the active region Act, and therefore two or more fins Fn may be formed.

The recess Re may be formed in a structure extending all over the active region Act in a diagonal direction with respect to the gate line 110. Depending on the structure of such the recess Re, the fin Fn on the active region Act may also be formed in a structure extending all over the active region Act in the diagonal direction with respect to the gate line 110. Regarding the diagonal directions of the recess Re and the fin Fn, these will be described in more detail in a following explanation of a first angle θ1 between the extending directions of the recess Re and the fin Fn and the gate line 110.

As shown in FIG. 2D, the recess Re may include an active region recess Rea formed on the active region Act and/or an isolation region recess Rei formed on the device isolation region 150. Depending on example embodiments, the isolation region recess Rei may be omitted. Further, the isolation region recess Rei may be formed substantially in the same direction as the active region recess Rea. Accordingly, the recess Re may be formed in both the active region Act and the device isolation region 150. The extending direction of the recess Re will be described in more detail in a following explanation of a direction of the channel and a width of the gate line 110.

The gate line 110 may extend in a second direction (a Y direction). For example, the gate line 110 may extend in the second direction (the Y direction) while covering a top surface and side surfaces of the fin Fn, and a bottom surface of the recess Re. A specific structure of the gate line 110 will be described in more detail in a following explanation of FIG. 9F.

Spacers 114 may be formed on both sides of the gate line 110. In FIG. 1, the spacers 114 are omitted. The spacers 114 may be formed on both sides of the gate line 110 in portions corresponding to the fin Fn, as shown in FIG. 2A. However, the spacers 114 may be formed on both sides of the gate line 110 and formed on an upper surface of the active region Act in portions corresponding to the recess Re, as shown in FIG. 2B. Namely, in the portions corresponding to the recess Re, the spacers 114 may extend from both sides of the gate line 110 onto the upper surface of the active region Act. This is because firstly a material film for forming spacers may be formed on a portion of the recess Re thicker than on the upper surfaces of the fin Fn and the gate line 110, and then in the process of forming the spacers 114 by an etching process, all of the material film for forming spacers formed on the upper surfaces of the fin Fn and the gate line 110 may be removed, but a portion of the material film for forming spacers formed on the recess Re may remain. For example, the spacer 114 in the portion of the recess Re may have a first thickness D1, and the first thickness D1 may be substantially equal to a depth of the recess Re. Depending on example embodiments, the first thickness D1 of the spacer 114 may be less than the depth of the recess Re.

A dielectric film 112 may be disposed on a lower surface of the gate line 110. The dielectric film 112 may extend in the second direction (the Y direction) while covering the top surface and side surfaces of the fin Fn and the bottom surface of the recess Re in the same manner as the gate line 110. The dielectric film 112 may have a uniform thickness on the top surface and side surfaces of the fin Fn and on the bottom surface of the recess Re. For example, when the dielectric film 112 has a first thickness T1 on the top surface of the fin Fn and the dielectric film 112 has a second thickness T2 on the bottom surface of the recess Re, the first thickness T1 may be substantially equal to the second thickness T2.

For reference, in a case of the conventional transistor structure including a fin, the fin may be formed in an elevated structure on an active region through epitaxial growth. Further, an isolating film of insulating material may be formed in a lower portion between the fins. The isolating film may act as a dielectric film and thus the dielectric film may be formed thickly in a portion between the fins, and therefore formation of a channel between the fins may be difficult.

In the case of the multi-direction channel transistor 100 according to some example embodiments of the inventive concepts, the recess Re may be formed on the active region Act through the etching process, and therefore the fin Fn may be formed through formation of the recess Re. Meanwhile, a separate isolating film may not be arranged in the recess Re between the fins Fn. Therefore, the dielectric film 112 may be formed substantially in the same thickness on the top surface of the fin Fn and the bottom surface of the recess Re, and the active region Act under a portion of the recess Re between the fins Fn may act as a channel region.

The dielectric film 112 may include a high-k dielectric material. For example, the dielectric film 112 may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), Titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobium oxide ($PbZnNbO_3$), and the like.

The dielectric film 112 may include metal oxide, or silicate or aluminates thereof. In addition, the dielectric film 112 may include metal nitride oxide, or silicate or aluminate thereof. Further, the dielectric film 112 may include perovskite-type oxide, niobate or tantalate-based system materials, tungsten-bronze-based system material, and Bi-layered perovskite-based system material, and the like.

As shown in FIG. 2D, the dielectric film 112 may also be formed on the device isolation region 150. Depending on example embodiments, the dielectric film 112 may not be formed on the device isolation region 150.

A contact 140 may be formed on the source/drain region 120. The contact 140 may be formed in a structure that is inserted into an upper portion of the source/drain region 120. In addition, the contact 140 may be formed so as to pass through the spacer 114 formed in the portion of the recess Re. In other words, the contact 140 may be connected to the source/drain region 120 through the spacer 114 in the portion of the recess Re.

A second thickness D2 corresponding to the depth at which the contact 140 is inserted from the top surfaces of the source/drain region 120 or the spacer 114 into the source/drain region 120 may be greater than the first thickness D1, which is the thickness of the spacer 114. As shown in FIG. 2C, a lower surface of the contact 140 may be lower than the bottom surface of the recess Re, and also all of the lower surface of the contact 140 may be lower than the bottom surface of the recess Re. Thus, the contact 140 may have a structure that may completely cut the fin Fn by intersecting with the extending direction of the fin Fn. Thus, by having the structure in which the contact 140 may completely cut the fin Fn, cut surfaces of the fin Fn may entirely contact a portion of side surfaces of the contact 140. Accordingly, the electrical characteristics between the fin Fn and the contact 140 may be improved, and thus the operational characteristics of the transistor may be improved.

In the case of a conventional transistor including a fin, a contact may be formed in a structure in which the contact surrounds a top surface and portions of side surfaces of the fin. Therefore, the electrical characteristics between the fin and the contact, and thus the operational characteristics of the transistor may not be good. In contrast, in the multi-direction channel transistor 100 of some example embodiments, the contact 140 may be formed such that the entirety of cut surfaces of a fin Fn structure is in contact with the side surface of the contact 140, and therefore the problems of the conventional transistor may be effectively reduced or prevented.

Depending on example embodiments, the lower surface of the contact 140 may be formed higher than the bottom surface of the recess Re. In such a case, the contact 140 may have a structure that the contact 140 may cut an upper portion of the fin Fn by intersecting with the extending direction of the fin Fn, so that the upper portion of the fin Fn may contact the side surface of the contact 140. In addition, depending on example embodiments, the contact 140 may be formed in a structure that the contact 140 may cover the upper surface and the side surfaces of the fin Fn and the recess Re without cutting the fin Fn, similar to the gate line 110.

When a plurality of recesses Re are formed on the active region Act, the contact 140 may be formed so as to cover all of the plurality of recesses Re in one direction. In other words, the contact 140 may overlap all of the plurality of recesses Re in one direction. In addition, the lower surface of the contact 140 may be formed lower than the bottom surfaces of all of the plurality of recesses Re. Thus, all of the fins Fns formed by the plurality of recesses Re may contact the side surface of the contact 140.

For example, as shown in FIG. 1, when the contact 140 has a shape extending in the second direction (the Y direction) and two recesses Re are formed in the diagonal direction, the contact 140 may cover all of the two recesses Re together in the second direction (the Y direction). In other words, the contact 140 may overlap all of the two recesses Re in the second direction (the Y direction). Further, the lower surface of the contact 140 may be formed lower than the bottom surface of both of the two recesses Re, so that the fin Fn formed by the two recesses Re may contact the side surface of the contact 140. In addition, as shown in FIG. 2C, a portion of the fin, which is disposed between the device isolation region 150 and the recess Re, may also contact the side surface of the contact 140.

The multi-direction channel transistor 100 of some example embodiments may include a fin Fn formed on the active region Act through the recess Re. Further, the recess Re and the fin Fn formed therefrom may extend in a diagonal direction with respect to the gate line 110. For example, the direction in which the recess Re and the fin Fn extend may have the first angle θ1 with respect to the second direction (the Y direction) in which the gate line 110 extends. The first angle θ1 may be an acute angle smaller than 90°. Specifically, in the multi-direction channel transistor 100 of some example embodiments, the first angle θ1 may have an angle of 30° to 70°. However, the first angle θ1 is not limited to the above numerical value. For example, the first angle θ1 may be less than 30°, or greater than 70°.

In the multi-direction channel transistor 100 of some example embodiments, an effective width of the gate line 110, e.g., the effective width of a gate, may be increased by forming the fin Fn through the recess Re formed by the etching process. In general, a channel length may be defined in a direction in which current flows, and a channel width may be defined in a direction perpendicular to a direction in which the current flows, in a transistor. Further, the channel length may correspond to an effective length of the gate, and the channel width may correspond to the effective width of the gate. For example, in FIG. 1, the channel length or the effective length of the gate may be defined in the direction in which the fin Fn extends, and the channel width or the effective width of the gate may be defined in the second direction (the Y direction).

As shown in FIG. 2D, since both the recess Re and the fins Fn formed therefrom may be formed under the gate line 110, the effective width of the gate may be increased. In addition, since the recess Re and the fin Fn may be formed in a diagonal direction with respect to the gate line 110, the effective length of the gate may also be increased, compared to a structure in which the recess Re and the fin Fn are formed in a direction perpendicular to the gate line 110.

When the effective length of the gate is increased, the problem such as the short channel effect may be reduced or prevented and reliability may be improved. Further, when the effective width of the gate is increased, on/off operation characteristics of the transistor may be improved. In other words, when the effective width of the gate is increased, an on-current increases at the same off-current, so that a threshold voltage may be reduced, and thus the on/off operation characteristics of the transistor may be improved.

Increase of the effective length and the effective width of the gate may contribute to improving dispersion σ of the threshold voltage. Here, the dispersion σ of the threshold voltage means a dispersion with respect to difference or mismatch of the threshold voltage between adjacent transistors and may be expressed by the following Equation (1).

$$\sigma(Vth-RDF)=Bvt[Tinv(Vth+0.1)/(L*W)]^{1/2} \quad \text{Equation (1)}$$

In Equation (1), Bvt denotes a slope of the Takeuchi plot, Tinv denotes a thickness of a dielectric film, and L and W denote a gate length and a gate width, respectively. Based on Equation (1), it may be understood that, when the gate length L and/or the gate width W is increased, the dispersion σ of the threshold voltage may be reduced.

In addition, when the dispersion (σ) of the threshold voltage of the multi-direction channel transistor 100 of some example embodiments is compared to that of the conventional reference transistor, the dispersion (σ) of the threshold voltage may be somewhat similar to that of the conventional reference transistor, but mismatch value of the threshold voltage corresponding to a center value of 50% may be decreased, compared to that of the conventional reference transistor. Ultimately, the dispersion σ of the threshold voltage of the multi-direction channel transistor 100 of some example embodiments of the inventive concepts may be expected to be reduced compared to the conventional reference transistor.

In the multi-direction channel transistor 100 of some example embodiments, the direction of the channel may be determined by the direction in which the fin Fn extends. For example, when the recesses Re and the fin Fn therefrom are formed in the diagonal direction with respect to the gate lines 110, the direction of the channel may also be formed in the diagonal direction with respect to the gate line 110. When the contact 140 is formed as shown in FIG. 1 and a voltage is applied to the source/drain region 120 through the contact 140, it may be likely that most of the currents flow through the fin Fn in a turn-on state, so that the extending direction of the fin Fn may correspond to the direction of the channel. Accordingly, in the multi-direction channel transistor 100 of some example embodiments of the inventive concepts, a term "multi-direction" may mean that the channel direction may be variously determined depending on the extending directions of the recess Re and the fin Fn therefrom. In the multi-direction channel transistors of the following example embodiments, the term "multi-direction" may be used in the same sense.

FIGS. 3A to 3D are plan views of multi-direction channel transistors according to some example embodiments of the inventive concepts. The descriptions previously given above with reference to FIGS. 1 to 2D are briefly provided or omitted.

Figure 3A:
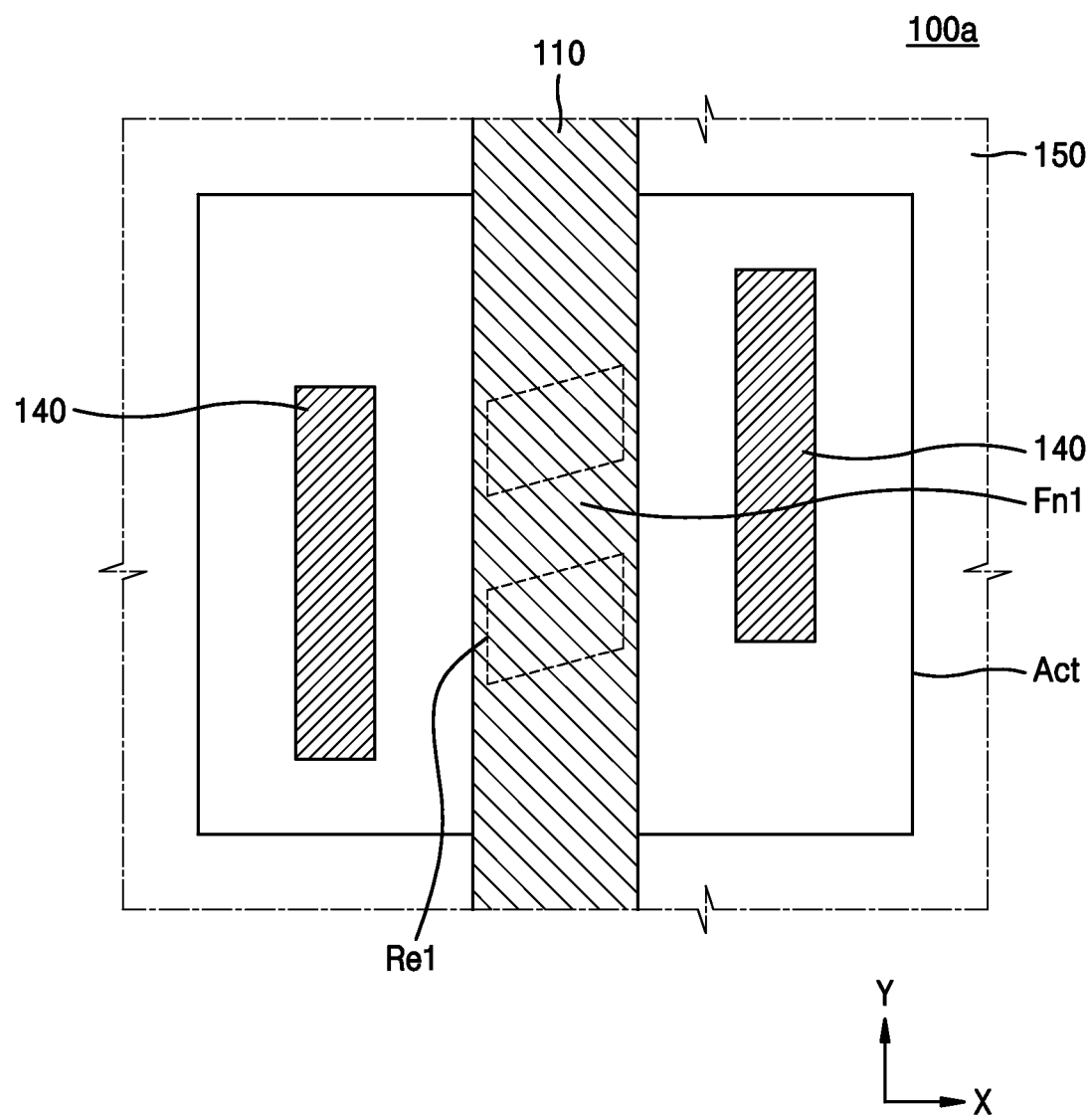
FIGS. 3A to 3D are plan views of multi-direction channel transistors according to some example embodiments of the inventive concepts.

Referring to FIG. 3A, the multi-direction channel transistor 100a of some example embodiments may be different from the multi-direction channel transistor 100 of FIG. 1 in the form of a recess Re1. Specifically, in the multi-direction channel transistor 100a of some example embodiments, the recess Re1 may be formed only under the gate line 110. Accordingly, a fin Fn1 disposed adjacent to the recess Re1 may be formed only under the gate line 110.

Alternatively, extending directions of the recess Re1 and the fin Fn1 may be diagonal directions with respect to the gate line 110. However, since the recess Re1 and the fin Fn1 may be formed only under the gate line 110, an angle between the extending directions of the recess Re1 and the fin Fn1 and the gate line 110 may not be significant. For example, the recess Re1 and the fin Fn1 may extend in a parallel direction or a perpendicular direction with respect to the gate line 110.

Although not shown, since the recess Re1 may be formed only under the gate line 110, a spacer (see the spacer 114 in FIG. 2A) may be formed only on side surfaces of the gate line 110. In addition, the contact 140 may be formed in a structure that the contact 140 is inserted into the upper portion of the source/drain region 120, and the contact 140 may not have a portion penetrating the spacer 114.

Figure 3B:
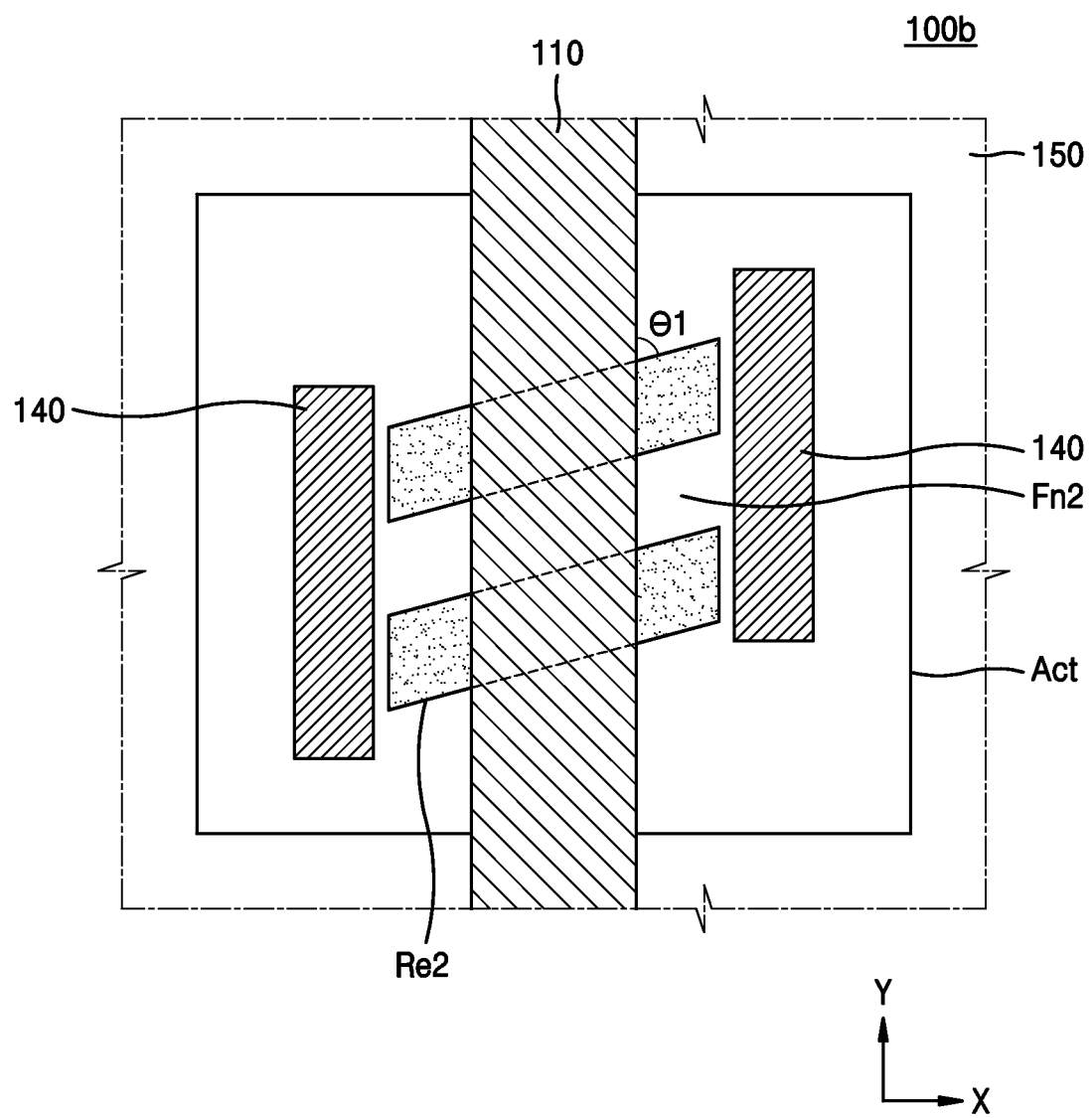

Referring to FIG. 3B, the multi-direction channel transistor 100b of some example embodiments may be different from the multi-direction channel transistor 100 of FIG. 1 in the form of a recess Re2. Specifically, in the multi-direction channel transistor 100b of some example embodiments, the recess Re2 may be formed in a structure extending from a lower portion of the gate line 110 to outsides of both sides of the gate line 110. In addition, a fin Fn2 disposed adjacent to the recess Re2 may also be formed in a structure extending from the lower portion of the gate line 110 to outsides of both sides of the gate line 110.

Extending directions of the recess Re2 and the fin Fn2 may be diagonal to the gate line 110. For example, the direction in which the recess Re2 and the fin Fn2 extend may have the first angle θ1 with respect to the second direction (the Y direction) in which the gate line 110 extends. The first angle θ1 may be an acute angle smaller than 90°, and in the multi-direction channel transistor 100b of some example embodiments, the first angle θ1 may have an angle of 30° to 70°. However, the first angle θ1 is not limited to the above numerical value.

Figure 3C:
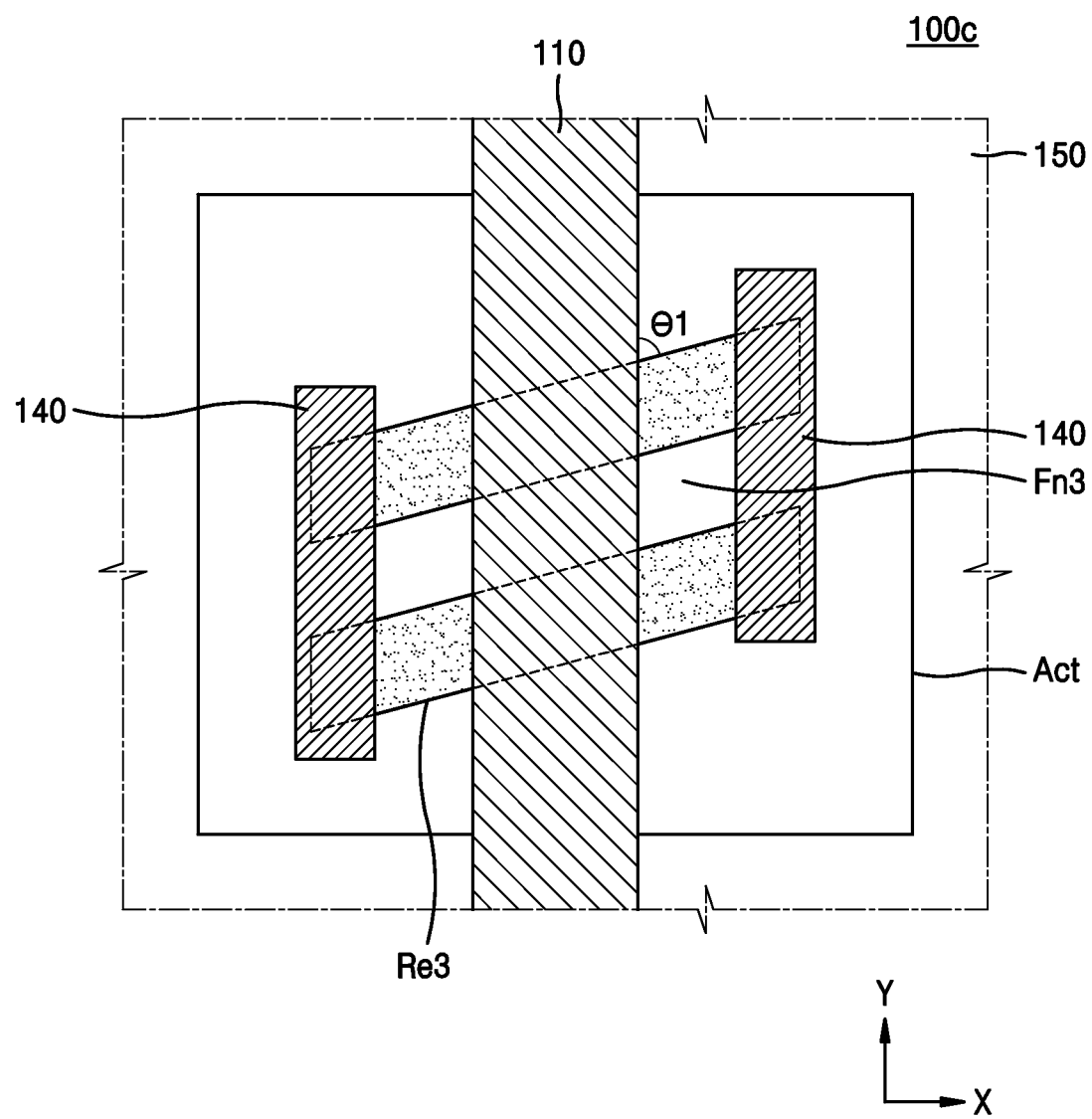

Referring to FIG. 3C, the multi-direction channel transistor 100c of some example embodiments may be different from the multi-direction channel transistor 100 of FIG. 1 in the form of a recess Re3. Specifically, in the multi-direction channel transistor 100c of some example embodiments, the recess Re3 may extend from the lower portion of the gate line 110 to a lower portion of the contact 140 while extending outward from both sides of the gate line 110. In addition, a fin Fn3 disposed adjacent to the recess Re3 may also extend from the lower portion of the gate line 110 to the lower portion of the contact 140 while extending outward from both sides of the gate line 110. Even though a portion which corresponds to the recess Re3 in a region of the contact 140 is shown as a dashed line in FIG. 3C, because a lower surface of the contact 140 may be formed deeper than the bottom surface of the recess Re3, the bottom surface of the recess Re3 may not actually be present. In addition, the fin Fn3 formed by the recess Re3 may extend only to the side surface of the contact 140 due to the structure of the contact 140.

Extending directions of the recess Re3 and the fin Fn3 may be diagonal with respect to the gate line 110. For example, the directions in which the recess Re3 and the fin Fn3 extend may have the first angle θ1 with respect to the second direction (the Y direction) in which the gate line 110 extends. The first angle θ1 may be an acute angle smaller than 90°, and in the multi-direction channel transistor 100c of some example embodiments, the first angle θ1 may have an angle of 30° to 70°. However, the first angle θ1 is not limited to the above numerical value.

Figure 3D:
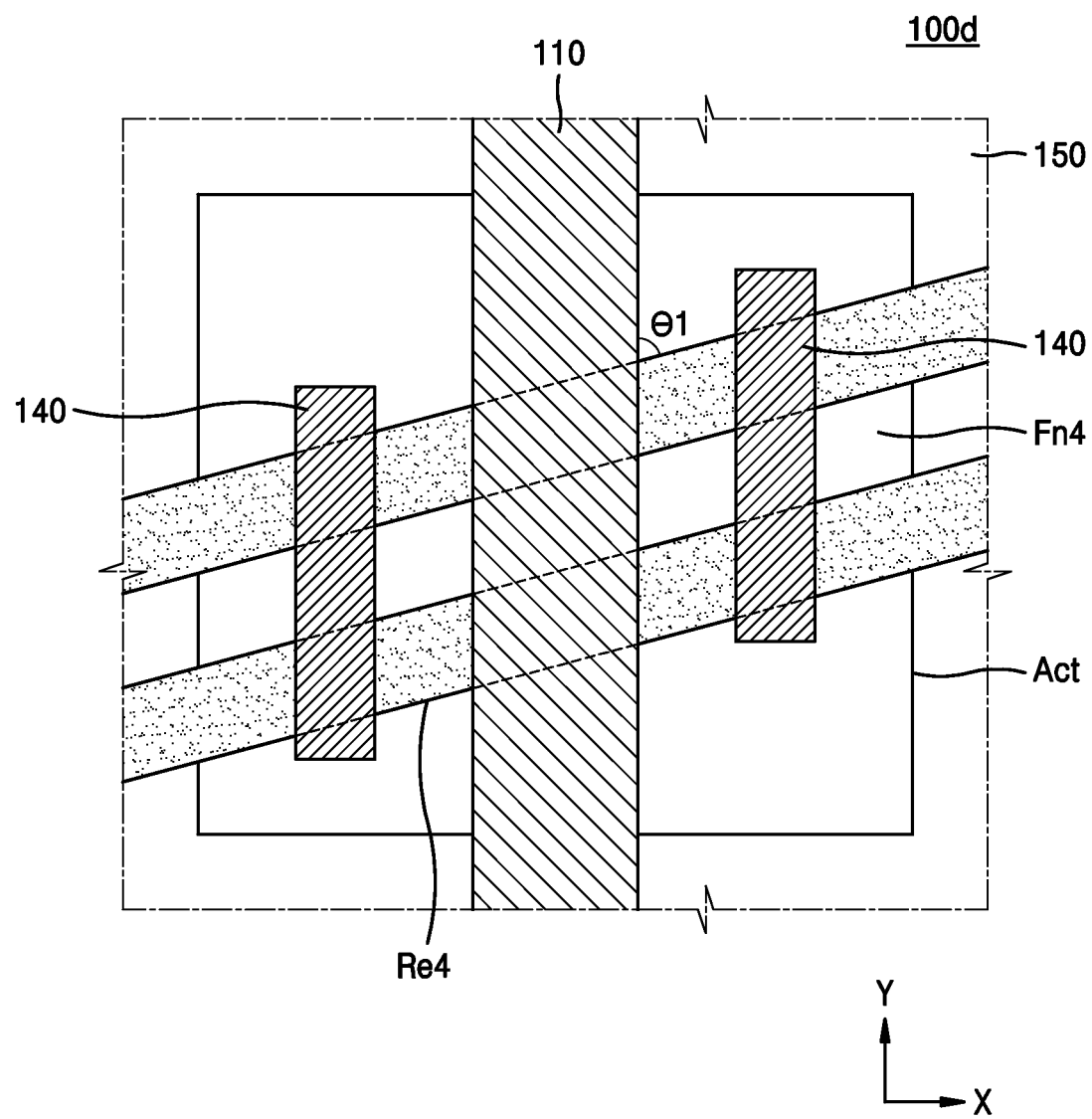

Referring to FIG. 3D, the multi-direction channel transistor 100d of some example embodiments may be different from the multi-direction channel transistor 100 of FIG. 1 in the form of a recess Re4. Specifically, in the multi-direction channel transistor 100d of some example embodiments, the recess Re4 may extend from the lower portion of the gate line 110 to the device isolation region 150 outside of the active region Act while extending outward from both sides of the gate line 110 across the contact 140. However, the fin Fn4 may be disposed only in the active region Act. Accordingly, the fin Fn4 may have substantially the same structure as the fin Fn of the multi-direction channel transistor 100 of FIG. 1. Further, the structures of the recess Re4 and the fin Fn4 in relation to the contact 140 may be the same as described in the description of FIGS. 1 to 2D. Furthermore, extending directions of the recess Re4 and the fin Fn4 may also be the same as described in the description of FIGS. 1 to 2D.

Figure 4:
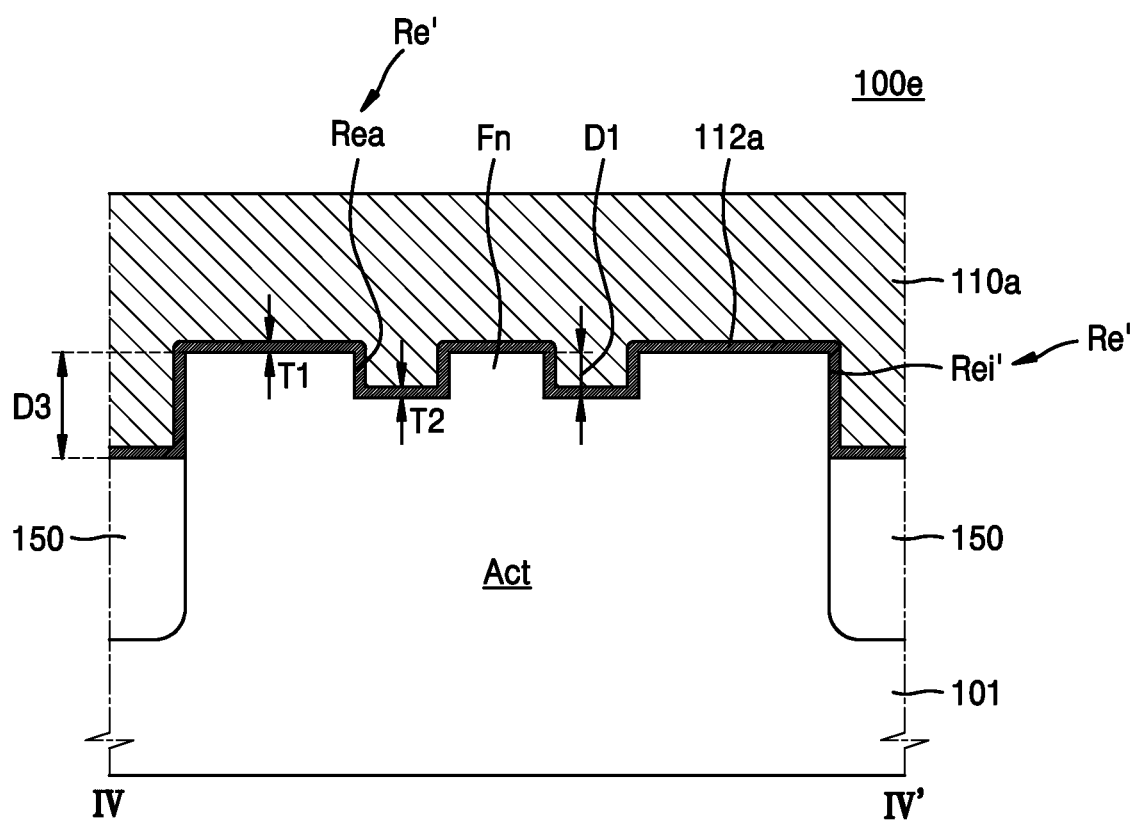
FIG. 4 is a cross-sectional view of a multi-direction channel transistor according to some example embodiments of the inventive concepts.

FIG. 4 is a cross-sectional view of a multi-direction channel transistor according to some example embodiments of the inventive concepts, and may correspond to FIG. 2D. The descriptions previously given above with reference to FIGS. 1 to 3D is briefly provided or omitted.

Referring to FIG. 4, a multi-direction channel transistor 100e of some example embodiments may be different from the multi-direction channel transistor 100 of FIG. 1 in the form of a recess Re'. Specifically, in the multi-direction channel transistor 100e of some example embodiments, the recess Re' may include an active region recess Rea formed on the active region Act and an isolation region recess Rei' formed on the device isolation region 150. In the multi-direction channel transistor 100 of FIG. 1, the active region recess Rea and the isolation region recess Rei may be formed to have the same depth. For example, both the active region recess Rea and the isolation region recess Rei may be formed with the depth corresponding to the first thickness D1. Alternatively, in the multi-direction channel transistor 100e of some example embodiments, the isolation region recesses Rei' may be formed deeper than the active region recesses Rea. For example, the active region recess Rea may be formed at the depth corresponding to the first thickness D1, the isolation region recess Rei' may be formed at a depth corresponding to a third thickness D3, the third thickness D3 may be greater than the first thickness D1.

In the multi-direction channel transistor 100e of some example embodiments, because a recess Re' is formed in a structure as described above, a portion of a dielectric film 112a formed in the isolation region recess Rei' may be located lower than a portion of the dielectric film 112a formed in the active region recess Rea.

Depending on example embodiments, the isolation region recess Rei' may be formed to be shallower than the active region recess Rea. For example, the third thickness D3 may be less than the first thickness D1. Further, as described above, a recess may not be formed in the device isolation region 150.

In the multi-direction channel transistor 100e of some example embodiments, the structures in relation to the extending direction of the recess Re' may be variously formed as in the multi-direction channel transistors 100, and/or 100a to 100d of FIGS. 1 to 3D. For example, the recess Re' may be formed in various structures including a structure formed only on the lower portion of the gate line 110a, a structure extended outward from both sides of the gate line 110a, a structure extended to the contact 140, a structure extending all over the active region Act, and a structure extending to the device isolation region 150, and the like.

Figure 5A:
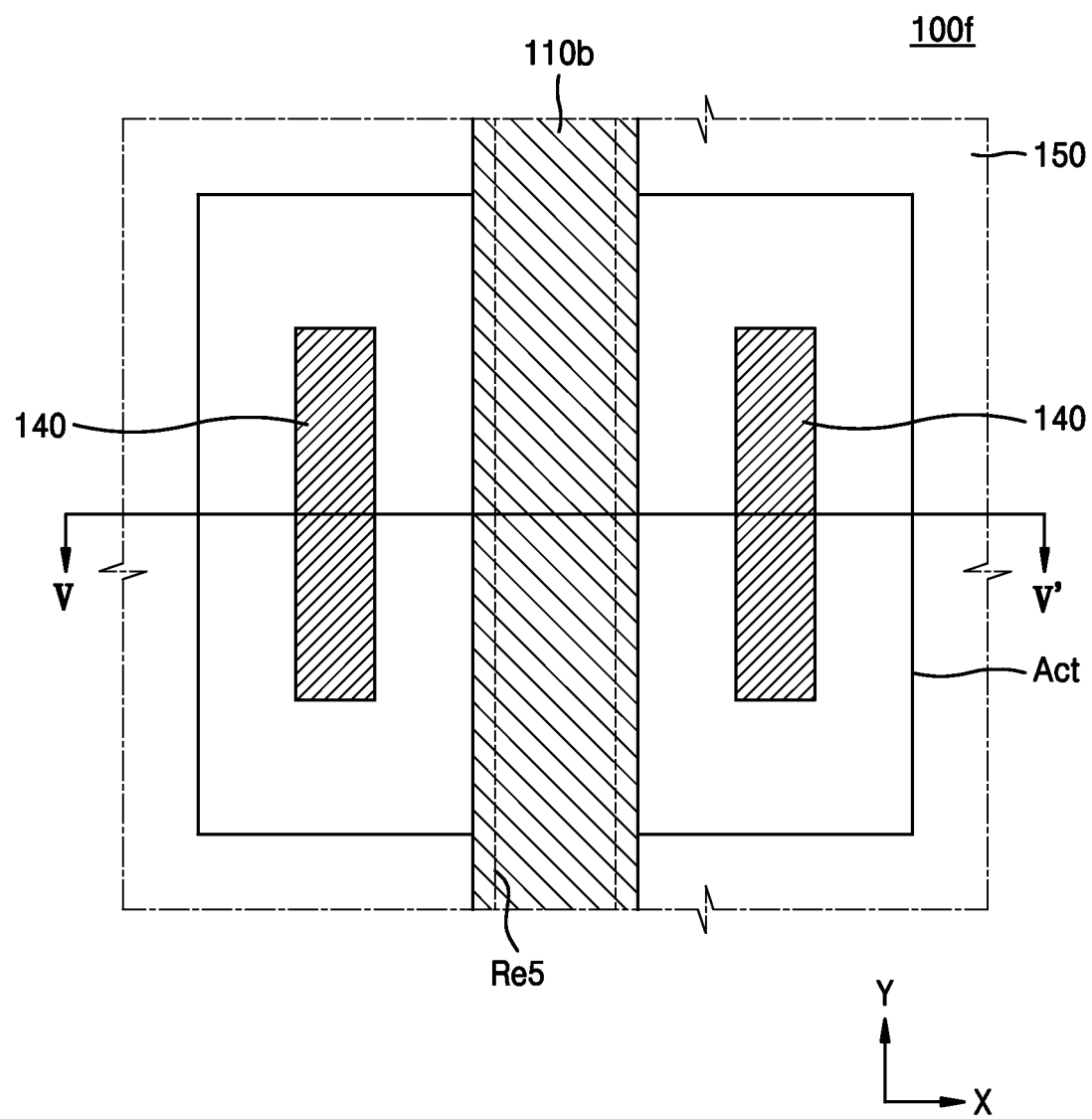
FIG. 5A is a plan view of a multi-direction channel transistor according to some example embodiments of the inventive concepts.
Figure 5B:
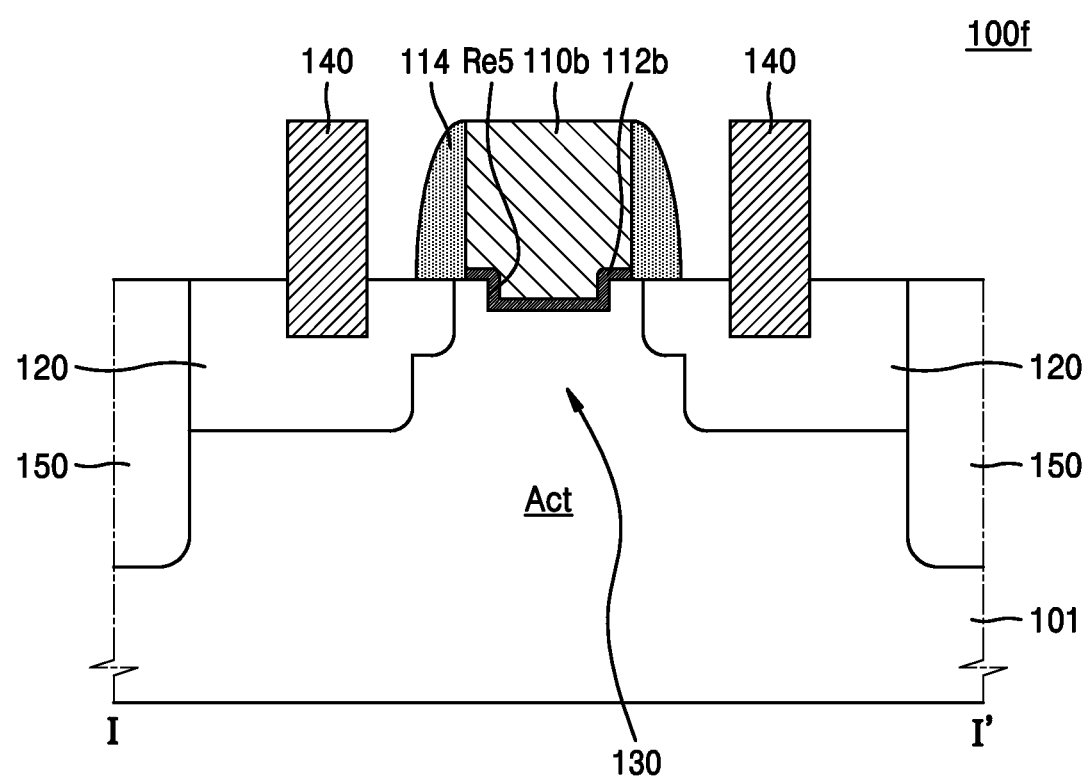
FIG. 5B is a cross-sectional view taken along line V-V' of FIG. 5A.

FIG. 5A is a plan view of a multi-direction channel transistor according to some example embodiments of the inventive concepts, and FIG. 5B is a cross-sectional view taken along line V-V' of FIG. 5A. The descriptions previously given above with reference to FIGS. 1 to 4 are briefly provided or omitted.

Referring to FIGS. 5A and 5B, a multi-direction channel transistor 100f of some example embodiments may be different from the multi-direction channel transistor 100 of FIG. 1 in a direction of a recess Re5. Specifically, in the multi-direction channel transistor 100f of some example embodiments, the recess Re5 may be formed in a structure extending in a direction to which a gate line 110b extends under the lower portion of the gate line 110b, that is, in the second direction (the Y direction). As the recess Re5 is formed in this structure, a fin may not be formed.

As in the case of the multi-direction channel transistor 100a of FIG. 3A, a spacer (see 114 in FIG. 2A) may be formed only on sides of the gate line 110b. In addition, the contact 140 may also be formed in a structure that the contact 140 is inserted into the upper portion of the source/drain region 120. The contact 140 may not have a portion penetrating the spacer 114. In addition, the dielectric film 112b may be disposed on the lower surface of the gate line 110b.

In the case of the multi-direction channel transistor 100f of some example embodiments, because the recess Re5 may be formed in a structure extending in the second direction (the Y direction) under the lower portion of the gate line 110b, the effective length of the gate line 110b may be increased. Therefore, as described above, the short channel effect may be suppressed, so that reliability may be improved and dispersion σ of the threshold voltage may be improved.

Figure 6:
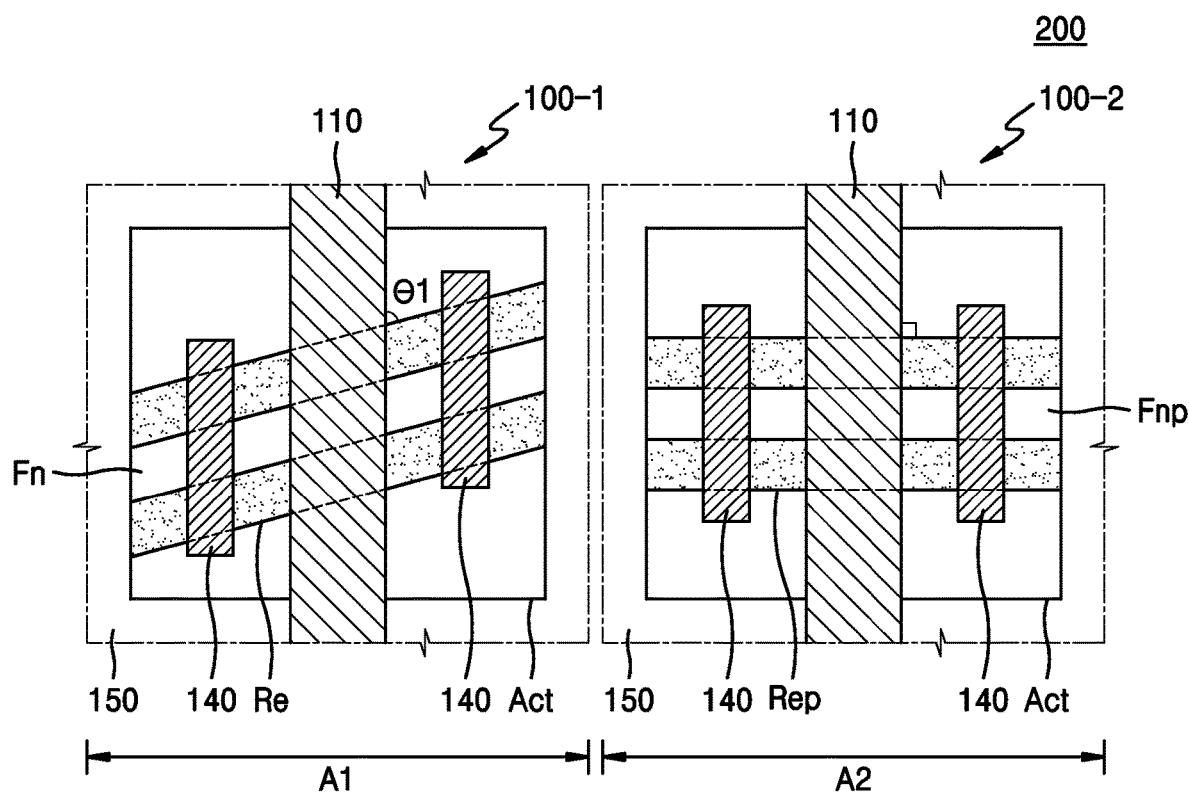
FIGS. 6 and 7 are plan views of multi-direction channel transistors according to some example embodiments of the inventive concepts.
Figure 6:
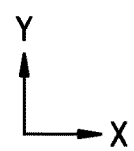
Figure 7:
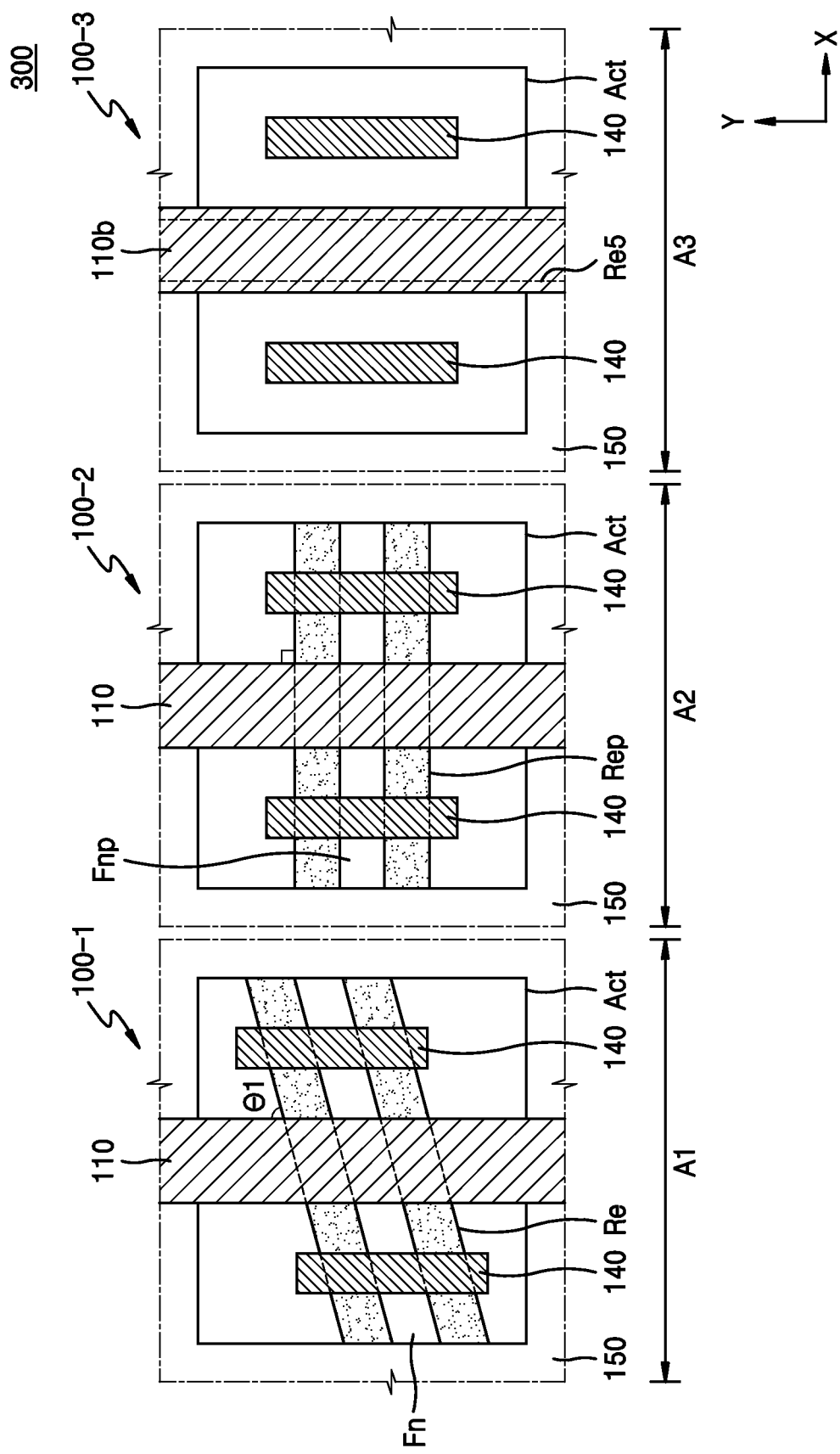

FIGS. 6 and 7 are plan views of multi-direction channel transistors according to some example embodiments of the inventive concepts. The descriptions previously given above with reference to FIGS. 1 to 5B are briefly provided or omitted.

Referring to FIG. 6, the multi-direction channel transistor 200 according to some example embodiments may include a first transistor 100-1 in a first region A1 and/or a second transistor 100-2 in a second region A2, on the substrate (see 101 in FIG. 2A).

A structure of the first transistor 100-1 may be substantially the same as the structure of the multi-direction channel transistor 100 of FIG. 1. Therefore, a detailed description thereof will be omitted. The structure of the first transistor 100-1 is not limited to the structure of the multi-direction channel transistor 100 of FIG. 1, and may be substantially the same as the structure of any one of the multi-direction channel transistors 100a to 100f of FIGS. 3A to 5A.

A structure of the second transistor 100-2 may be different from the structure of the first transistor 100-1 in the extending directions of recess Rep and a fin Fnp therefrom. Specifically, in the second transistor 100-2, the recess Rep and the fin Fnp may be extended in the direction perpendicular to the second direction (the Y direction) in which the gate line 110 extends, that is, in the first direction (the X direction). The structure of the spacer (see 114 in FIG. 2A), the dielectric film (see 112 in FIG. 2A), and/or the contact 140 and the like may be the same as those described for the multi-direction channel transistor 100 of FIG. 1.

In the second transistor 100-2, since the recess Rep and the fin Fnp are formed in the direction perpendicular to the gate line 110, the effective width of the gate line 110 may be increased. Accordingly, the on/off operation characteristics of the transistor may be improved, and the dispersion σ of the threshold voltage may be improved.

The structure of the second transistor 100-2 may be modified similarly to the structures of the multi-direction channel transistors 100a to 100e of FIGS. 3A to 4. For example, the second transistor 100-2 may have any one structure from among the structure in which the recess Rep and the fin Fnp are formed only under the lower portion of the gate line 110 similarly to the multi-direction channel transistor 100a of FIG. 3A, the structure in which the recess Rep and the fin Fnp are extended outwardly from the lower portion of the gate line 110 toward an outside of both sides of the gate line 110 similarly to the multi-direction channel transistor 100b of FIG. 3B, the structure in which the recess Rep and the fin Fnp are extended outwardly from the lower portion of the gate line 110 toward the outside of both sides of the gate line 110 and are extended to the contact 140 similarly to the multi-direction channel transistor 100c of FIG. 3C, and the structure in which the recesses Rep are extended from the lower portion of the gate line 110 toward the outside of both sides of the gate line 110 and then are extended to the device isolation region 150 through the contact 140 similarly to the multi-direction channel transistor 100d of FIG. 3D. Further, the second transistor 100-2 may be formed in the structure in which the isolation region recess (see Rei' in FIG. 4) is formed deeper than the active region recess (see Rea in FIG. 4) similarly to the multi-direction channel transistor 100e of FIG. 4.

Referring to FIG. 7, the multi-direction channel transistor 300 according to some example embodiments may include the first transistor 100-1 in the first region A1, the second transistor 100-2 in the second region A2, and/or a third transistor 100-3 in a third region A3, on the substrate (see 101 in FIG. 2A).

A structure of the first transistor 100-1 may be substantially the same as the structure of the multi-direction channel transistor 100 of FIG. 1. However, the structure of the first transistor 100-1 is not limited to the structure of the multi-direction channel transistor 100 of FIG. 1, and may be substantially the same as the structure of any one of the multi-direction channel transistors 100a to 100e of FIGS. 3A to 4.

A structure of the second transistor 100-2 may be substantially the same as the structure of the second transistor 100-2 of FIG. 6. Accordingly, a detailed description of the structure of the second transistor 100-2 will be omitted. The structure of the second transistor 100-2 may be modified similarly to any one from among the structures of the multi-direction channel transistors 100a to 100e of FIGS. 3A to 4. Wherein the first dielectric film of the first transistor 100-1 and the dielectric film of the second transistor 100-2 have the same thickness.

The structure of the third transistor 100-3 may be substantially the same as the structure of the multi-direction channel transistor 100f of FIG. 5A. That is, the recess Re5 may extend in the second direction (the Y direction) in which the gate line 110b extends under the lower portion of the gate line 110b.

In the multi-direction channel transistor 300 of some example embodiments, a plurality of transistors having a corresponding structure may be disposed in at least one of the first to third regions A1 to A3. In addition, depending on example embodiments, at least one from among the first to third regions A1 to A3 may be disposed as plural on the substrate 101.

In the multi-direction channel transistor 300 of some example embodiments, the first to third transistors 100-1 to 100-3 disposed on the first to third regions A1 to A3 may be formed at the same time or may be formed separately for each region. When the first to third transistors 100-1 to 100-3 are formed at the same time, the first to third regions A1 to A3 may be formed by performing the etching process together using the same mask. For example, the recesses Re, Rep, and Re5 and the fins Fn and Fnp included in the first to third transistors 100-1 to 100-3 are formed at the same time through one etching process using one mask.

Figure 8:
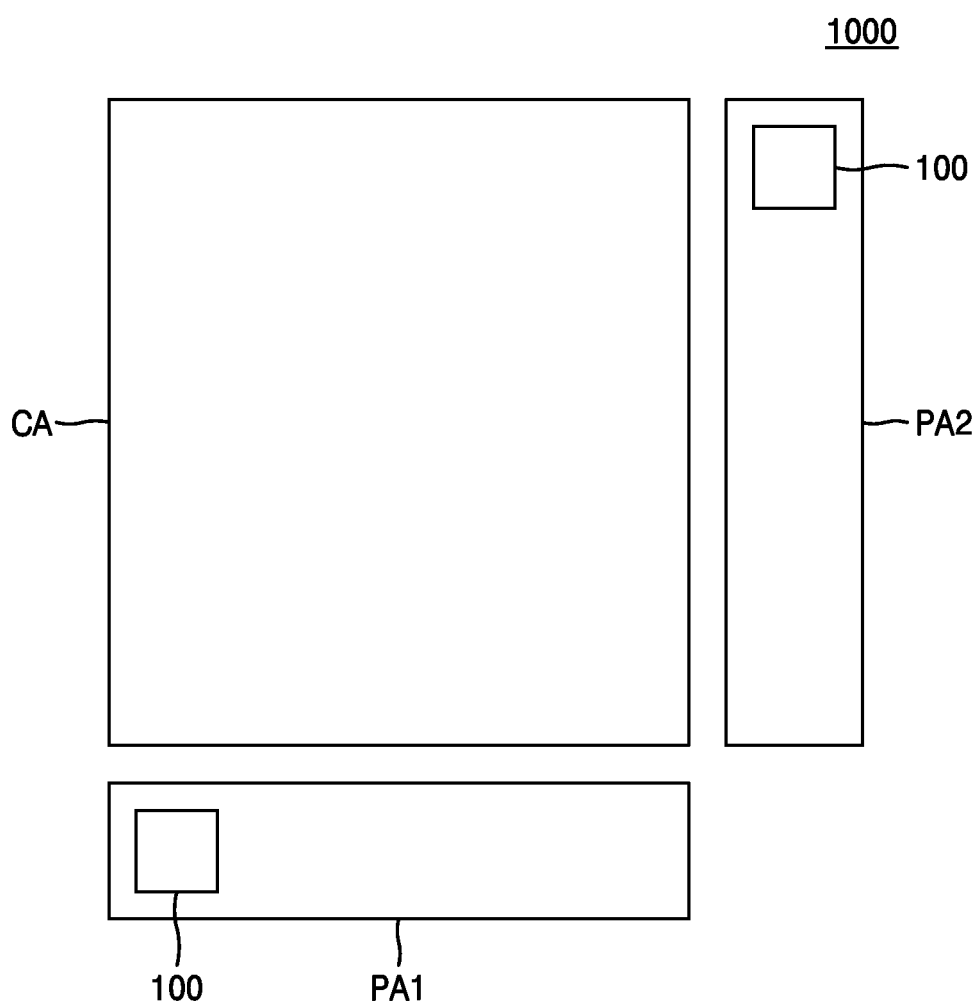
FIG. 8 is a plan view of a semiconductor device including a multi-direction channel transistor according to some example embodiments of the inventive concepts.

FIG. 8 is a plan view of a semiconductor device including the multi-direction channel transistor according to some example embodiments of the inventive concepts. The descriptions previously given above with reference to FIGS. 1 to 7 are briefly provided or omitted.

Referring to FIG. 8, the semiconductor device 1000 of some example embodiments may include a cell area CA and/or peripheral areas PA1 and/or PA2 disposed on a substrate. In the cell area CA, a plurality of cells may be arranged in an array structure. For example, in the case where the semiconductor device 1000 is a DRAM device or a flash memory device, a plurality of memory cells corresponding to each device in the cell area CA may be arranged in an array structure. Of course, the semiconductor device 1000 is not limited to the DARM device or the flash memory device. For example, the semiconductor device 1000 may be an image sensor device. In such a case, a plurality of pixels may be arranged in an array structure in the cell area CA.

The peripheral areas PA1 and/or PA2 may be provided with circuits for reading data from the cell area CA or writing data to the cell area CA, circuits for signal processing, and/or circuits for power supply. The peripheral areas PA1 and/or PA2 may also be referred to as core/peripheral areas. Further, depending on example embodiments, a circuit portion for reading/writing may be called as a core area, and a circuit portion for other signal processing or the like may be called as a peripheral area. In the semiconductor device 1000 of some example embodiments, the peripheral areas PA1 and/or PA2 may refer to all areas arranged around the cell area CA other than the cell area CA. Meanwhile, even though two peripheral areas PA1 and/or PA2 are arranged in the periphery of the cell area CA in FIG. 8, depending on example embodiments, one peripheral area, or three or more peripheral areas may be disposed around the cell area CA.

In the semiconductor device 1000 of some example embodiments, at least one multi-direction channel transistor 100 may be disposed in the peripheral areas PA1 and/or PA2. For example, when the semiconductor device 1000 of some example embodiments is a DRAM device, a sense amplifier (SA) transistor having a multi-direction channel transistor structure may be disposed in the peripheral areas PA1 and PA2. Of course, the transistor having the multi-direction channel transistor 100 structure disposed in the peripheral areas PA1 and/or PA2 is not limited to the SA transistor.

The multi-direction channel transistor 100 may have the structure of the multi-direction channel transistor 100 of FIG. 1. However, this is not limited thereto, the multi-direction channel transistor 100 of the peripheral areas PA1 and/or PA2 may have a structure of the at least one from among the multi-direction channel transistors 100a to 100f of FIGS. 3A to 5A. Also, depending on example embodiments, the peripheral areas PA1 and/or PA2 may be divided into a plurality of regions as in the multi-direction channel transistor 200 or 300 of FIG. 6 or 7, and any one from among the first to third transistors 100-1 to 100-3 may be arranged in each region.

FIGS. 9A to 9F are cross-sectional views illustrating a process of fabricating the multi-direction channel transistor of FIG. 1 according to some example embodiments of the inventive concepts, and may correspond to FIG. 2D. The descriptions previously given above with reference to FIGS. 1 to 2D are briefly provided or omitted.

Figure 9A:
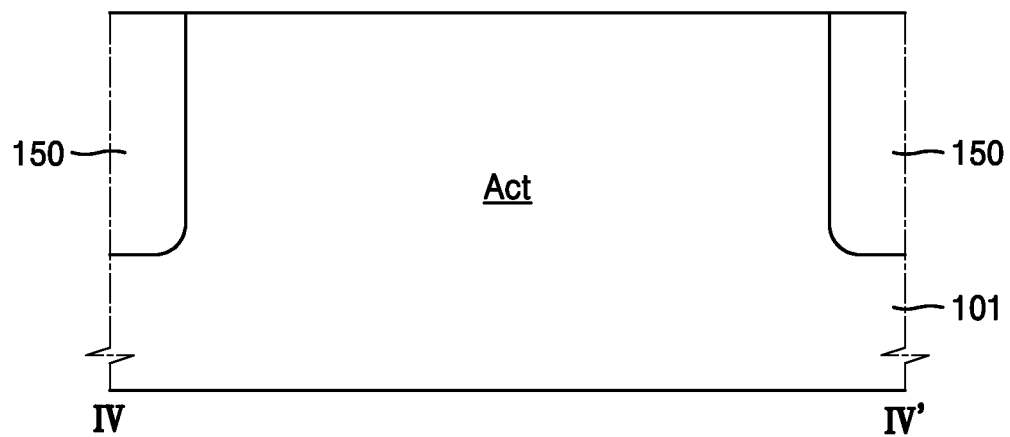
FIGS. 9A to 9F are cross-sectional views for describing a process for fabricating the multi-direction channel transistor of FIG. 1 according to some example embodiments of the inventive concepts.

Referring to FIG. 9A, the device isolation region 150 may be firstly formed on the substrate 101 to define the active region Act. The substrate 101 may be a silicon bulk substrate. However, the substrate 101 is not limited to the silicon bulk substrate. The device isolation region 150 may be formed by removing a predetermined (or alternatively given) portion of the upper portion of the substrate 101 through the etching process to form a trench and filling the trench with an oxide film, a nitride film, an oxynitride film, or the like. For example, the device isolation region 150 may be formed in a shallow trench isolation (STI) structure.

The active region Act disposed adjacent to the device isolation region 150 may have a rectangular shape on a plan view as viewed from above. However, the structure of the active region Act is not limited to the rectangular shape.

Figure 9B:
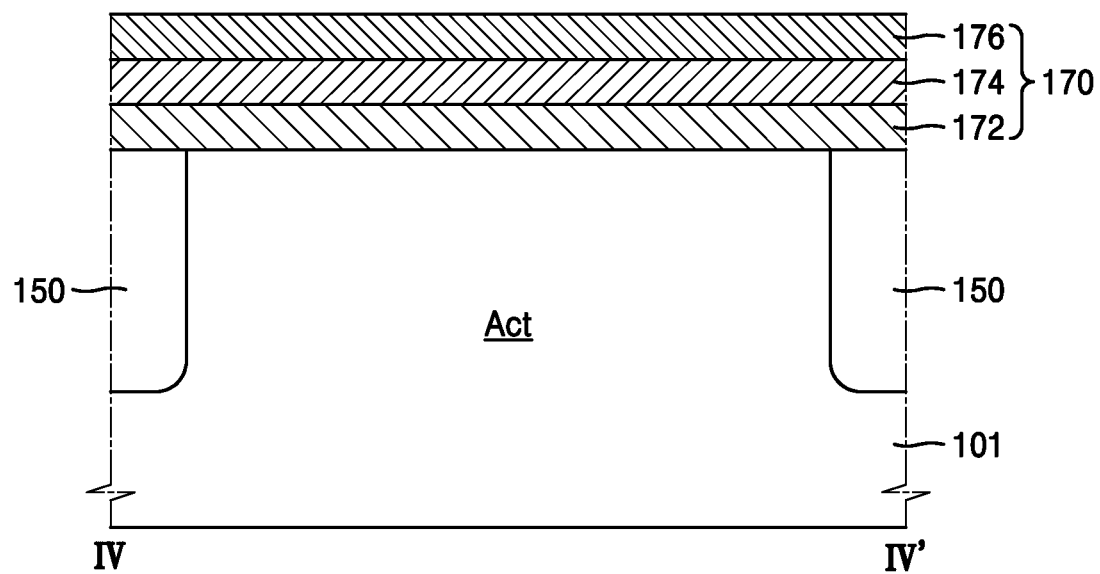

Referring to FIG. 9B, after the device isolation region 150 is formed, a hard mask 170 may be formed on the entire upper surface of the substrate 101. The hard mask 170 may have a multilayer structure. For example, the hard mask 170 may include an amorphous carbon layer (ACL) 172, an SiON film 174, and/or an anti-reflection coating (ARC) film 176. However, the multilayer structure of the hard mask 170 is not limited to this structure.

Figure 9C:
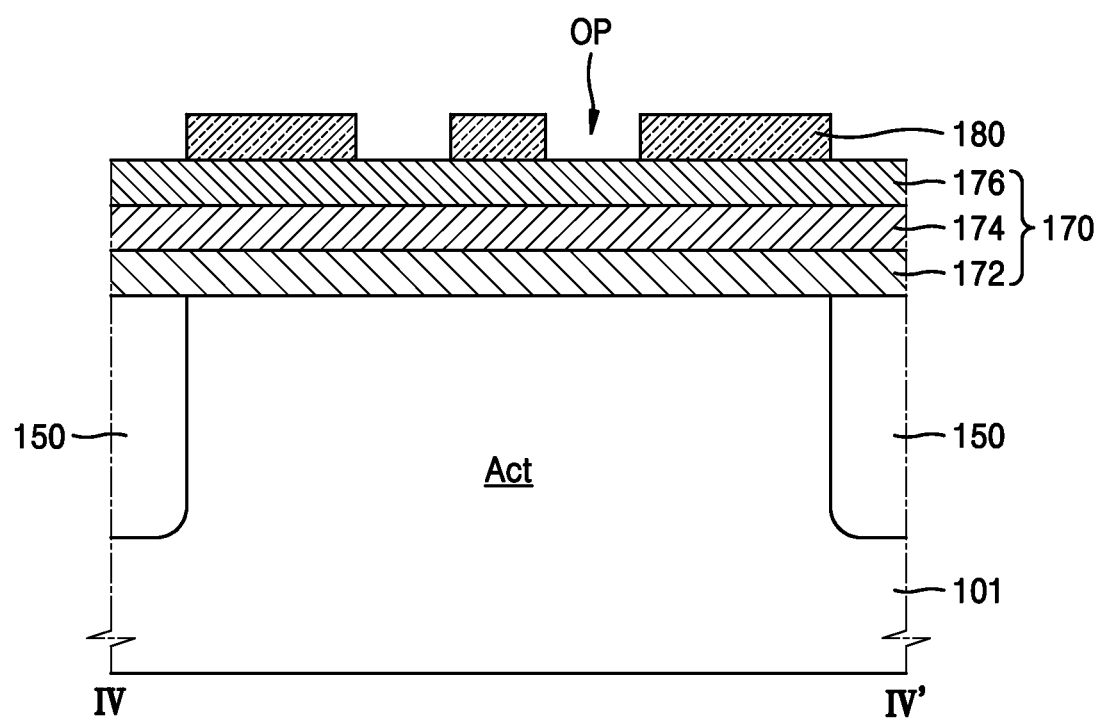

Referring to FIG. 9C, a photoresist (PR) pattern 180 may be formed on the hard mask 170 after the hard mask 170 is formed. The PR pattern 180 may be formed through a photolithography process and may include an open area OP that exposes a predetermined (or alternatively given) portion of the hard mask 170. The open area OP may correspond to the portion of the recess Re to be formed later in the active region Act and in the device isolation region 150. Depending on example embodiments, the recess Re may not be formed in the device isolation region 150. In such a case, the open area OP may not be formed at a portion corresponding to the device isolation region 150.

The open area OP may have a shape extending in one direction, and may have a shape extending in a diagonal direction with respect to the gate line 110 to be formed later, for example. Also, depending on example embodiments, the open area OP may have shapes corresponding to the recesses Re1 to Re4 of the multi-direction channel transistors 100a to 100d in FIGS. 3A to 3D. Furthermore, the open area OP may have a shape corresponding to the recess Re5 of the multi-direction channel transistor 100f of FIG. 5A, or corresponding to the recess Rep of the second transistor 100-2 of the multi-direction channel transistors 200 and 300 of FIGS. 6 and 7. When the transistors 100-1 to 100-3 are formed together at the same time as in the multi-direction channel transistors 200 and 300 of FIGS. 6 and 7, the open area OP of the PR pattern 180 may include the shapes corresponding to each of the recesses in the transistors 100-1 to 100-3.

Figure 9D:
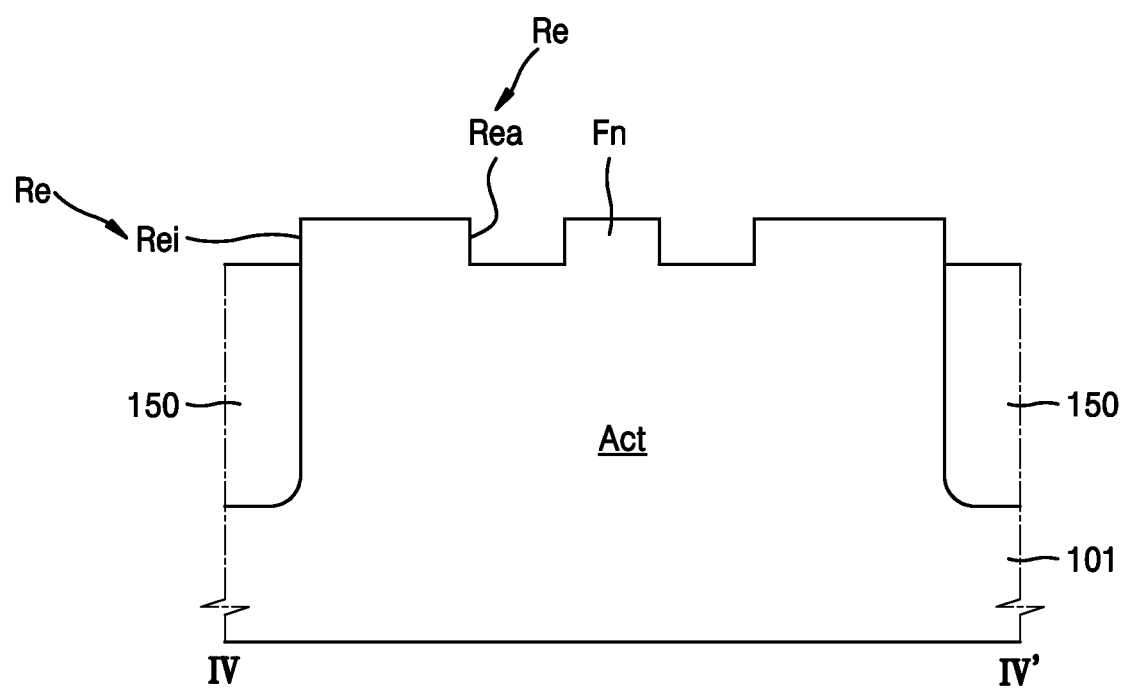

Referring to FIG. 9D, the recess Re may be formed by etching the active region Act and the device isolation region 150 by dry etching using the PR pattern 180 and the hard mask 170 as an etching mask. The recess Re may include the active region recess Rea on the active region Act and/or the isolation region recess Rei on the device isolation region 150. Depending on example embodiments, the isolation region recesses Rei may not be formed, as described above. Also, depending on example embodiments, the isolation region recesses Rei may be formed deeper than the active region recesses Rea by changing the process conditions of the etching process or the materials of the hard mask 170. When the recess is formed in such a structure, the structure of the multi-direction channel transistor 100e as some example embodiments illustrated in FIG. 4 may be implemented later.

Through formation of the recess Re, the fin Fn may be formed to be protruded upwardly in the active region Act. The fin Fn may have a shape extending in the same direction as the recess Re. Also, depending on the shape of the recess Re, the fin Fn may be formed in various shapes as in the multi-direction channel transistors 100a to 100d of FIGS. 3A to 3D.

Figure 9E:
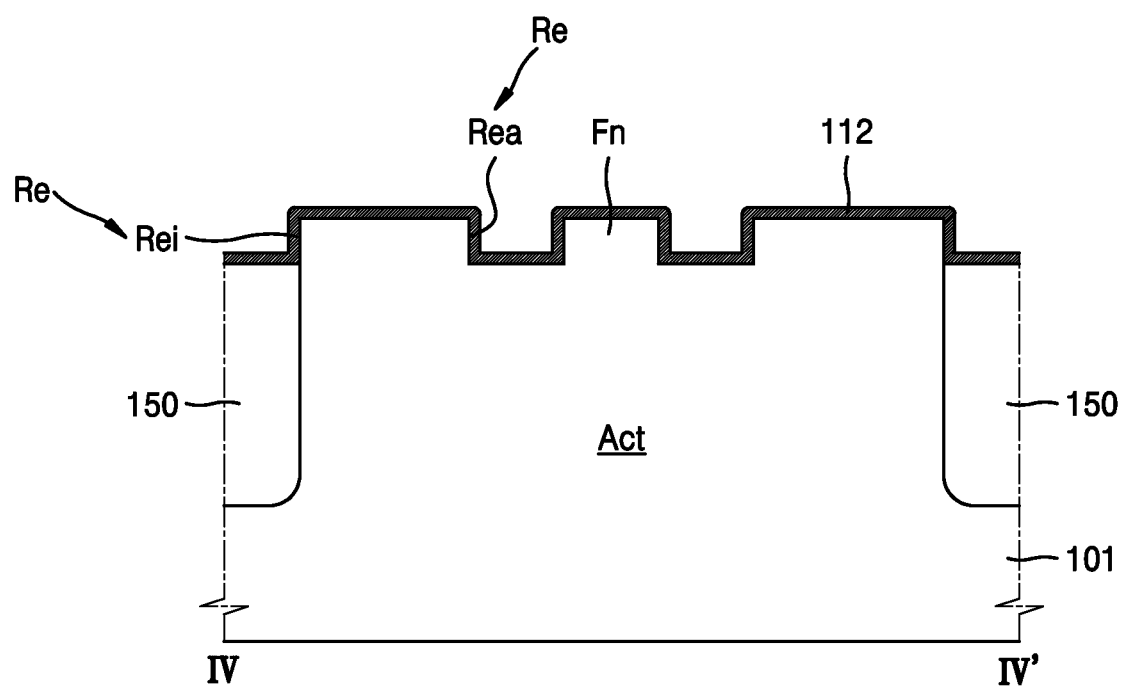

Referring to FIG. 9E, after forming the recesses Re, the dielectric film 112 covering the upper surface of the active region Act and the device isolation region 150 may be formed. The dielectric film 112 may include, for example, a high-k dielectric material. The dielectric film 112 may be formed by various deposition process such as chemical vapor deposition (CVD), low pressure CVD (LPCVD), atmospheric pressure CVD (APCVD), low temperature CVD (LTCVD), plasma enhanced CVD (PECVD), atomic layer deposition (ALD), and physical vapor deposition (PVD) and the like.

Figure 9F:
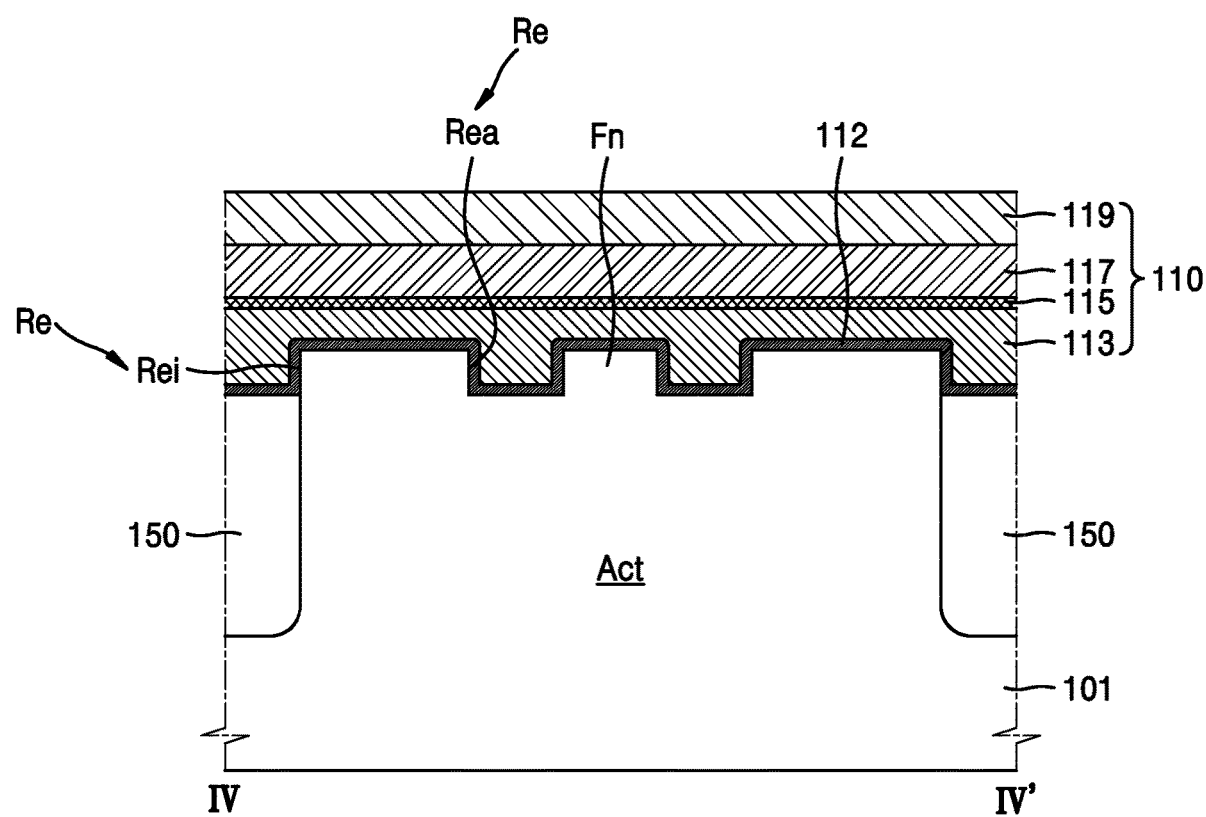

Referring to FIG. 9F, after forming the dielectric film 112, a multilayer for a gate line may be formed on the dielectric film 112. For example, the multilayer for the gate line may include a polysilicon film 113, a barrier metal film 115, a W film 117, and/or a SiN film 119. However, the structure of the multilayer for the gate line is not limited to the above structure. For example, depending on operating characteristics of the transistor, the multilayer for the gate line may include material films of various properties.

Thereafter, the gate line 110 may be formed by patterning the multilayer for the gate line. The gate line 110 may be formed to extend in the second direction (the Y direction). As described above, the extending direction of the recess Re may correspond to the diagonal direction with respect to the second direction (the Y direction) in which the gate line 110 extends. Alternatively, the dielectric film 112 disposed under the gate line 110 may be patterned together.

After forming the gate line 110, a material film for forming a spacer may be formed on the entire surface of the substrate 101 including the gate line 110, and the material film on the gate line 110 and the material film on the substrate 101 may be etched through the etching process to form the spacer 114 on the sides of the gate line 110. Alternatively, as described above, since the material film for forming the spacer is formed thick in the portion of the recess Re, the spacer 114 may be maintained in the portion of the recess Re.

While the inventive concepts have been particularly shown and described with reference to some example embodiments thereof, it will be understood that various changes in form and details may be made therein without departing from the spirit and scope of the following claims.

What is claimed is:
1. A multi-direction channel transistor comprising:
at least one fin on an active region on a substrate and disposed adjacent to a recess extending in a first direction;
a gate line covering at least a portion of the at least one fin and the recess and extending in a second direction crossing the first direction;
source/drain regions in the active region at both sides of the gate line; and a channel region in the active region under the gate line between the source/drain regions,
wherein the first direction is a diagonal direction with respect to the second direction, and
a dielectric film under the gate line has substantially the same thickness on both the at least one fin and the recess.

2. The multi-direction channel transistor of claim 1, wherein either the fin is only under the gate line, or the fin extends to outside of both sides of the gate line.

3. The multi-direction channel transistor of claim 1, wherein,
contacts are formed on the source/drain regions, and
the fin extends to the contacts.

4. The multi-direction channel transistor of claim 3, wherein,
lower surfaces of the contacts are deeper than a bottom surface of the recess, and
the fin is in contact with side surfaces of the contacts.

5. The multi-direction channel transistor of claim 1, wherein,
the active region is disposed adjacent to a device isolation region, and
the fin extends entirely over the active region in the first direction.

6. The multi-direction channel transistor of claim 5, wherein,
the fin extends to the device isolation region.

7. The multi-direction channel transistor of claim 1, wherein,
the active region is disposed adjacent to a device isolation region,
the recess includes an active region recess formed on the active region and an isolation region recess formed on the device isolation region, and
the isolation region recess is deeper than the active region recess.

8. The multi-direction channel transistor of claim 1, wherein,
the first direction has an angle of 30° to 70° with respect to the second direction.

9. The multi-direction channel transistor of claim 1, wherein,
a channel of the multi-direction channel transistor has a direction which is determined depending on a direction of the recess.

10. A multi-direction channel transistor comprising:
a first transistor including,
at least one first fin on a first active region on a substrate, and disposed adjacent to a first recess extending in a first direction, and
a first gate line extending in a second direction crossing the first direction and covering at least a portion of the at least one first fin and the first recess; and
a second transistor including,
at least one second fin on a second active region on the substrate, and disposed adjacent to a second recess extending in a third direction, and
a second gate line extending in a fourth direction and covering at least a portion of the at least one second fin and the second recess,
wherein the first direction is a direction perpendicular to the second direction, and the third direction is a diagonal direction with respect to the fourth direction.

11. The multi-direction channel transistor of claim 10, wherein,
a first dielectric film under the first gate line has substantially the same thickness on both the at least one first fin and the first recess, and
a second dielectric film under the second gate line has substantially the same thickness on both the at least one second fin and the second recess.

12. The multi-direction channel transistor of claim 11, wherein the first and second dielectric films have substantially the same thickness.

13. The multi-direction channel transistor of claim 10, wherein,
the first active region is disposed adjacent to a first device isolation region, and the second active region is disposed adjacent to a second device isolation region,
a first contact is on a first source/drain region of the first transistor, and a second contact is on a second source/drain region of the second transistor, and
the first fin is in the first active region and the second fin is in the second active region.

14. The multi-direction channel transistor of claim 13, wherein,
the first recess includes a plurality of first recesses,
the second recess includes a plurality of second recesses,
the first contact overlaps the plurality of first recesses,
the second contact overlaps the plurality of second recesses,
a bottom surface of the first contact is deeper than a bottom surface of the first recess,
a bottom surface of the second contact is deeper than a bottom surface of the second recess,
the at least one first fin contacts a side surface of the first contact, and
the at least one second fin contacts a side surface of the second contact.

15. The multi-direction channel transistor of claim 13, wherein,
the first recess extends to the first device isolation region outside the first active region, and/or
the second recess extends to the second device isolation region outside the second active region.

16. The multi-direction channel transistor of claim 13, wherein,
the first recess includes a first active region recess on the first active region, and a first isolation region recess on the first device isolation region,
the second recess includes a second active region recess on the second active region and a second isolation region recess on the second device isolation region, and
the first isolation region recess is deeper than the first active region recess and the second isolation region recess is deeper than the second active region recess.

17. The multi-direction channel transistor of claim 10, further comprising:
a third transistor having a third gate line extending in a fifth direction on a third active region on the substrate, and a third recess extending in the fifth direction on the third active region under the third gate line.

18. A semiconductor device comprising:
a substrate including a cell region and a peripheral region, the cell region having a plurality of cells, and the peripheral region disposed adjacent to the cell region, the peripheral region including at least one first transistor, wherein,
the at least one first transistor includes,
at least one first fin formed on a first active region on the peripheral region and disposed adjacent to a first recess extending in a first direction, and a first gate line extending in a second direction crossing the first direction and covering at least a portion of the at least one first fin and the first recess, the first direction is diagonal to the second direction on the first active region, and a dielectric film under the first gate line has substantially the same thickness on both the at least one first fin and the first recess.

19. The semiconductor device of claim 18, further comprising:

a second transistor including, at least one second fin on a second active region on the peripheral region and disposed adjacent to a second recess extending in a third direction, and a second gate line extending in a fourth direction and covering a portion of the at least one second fin and a portion of the second recess, wherein, the third direction is perpendicular to the fourth direction.

20. The semiconductor device of claim 18, wherein the semiconductor device includes a DRAM device, or a flash memory device.

* * * * *